United States Patent [19]

Yoshikawa

[11] Patent Number: 6,151,268
[45] Date of Patent: Nov. 21, 2000

[54] SEMICONDUCTOR MEMORY AND MEMORY SYSTEM

[75] Inventor: Takefumi Yoshikawa, Suita, Japan

[73] Assignee: Matsushita Electric Industrial Co., Ltd., Osaka, Japan

[21] Appl. No.: 09/233,317

[22] Filed: Jan. 19, 1999

[30] Foreign Application Priority Data

Jan. 22, 1998 [JP] Japan .................................. 10-010224
Mar. 3, 1998 [JP] Japan .................................. 10-050466

[51] Int. Cl.⁷ ...................................................... G11C 8/00

[52] U.S. Cl. ................................ 365/230.09; 365/230.03

[58] Field of Search ........................... 365/230.03, 230.09

[56] References Cited

U.S. PATENT DOCUMENTS 5,663,905 9/1997 Matsuo ..................................... 365/149
5,953,244 9/1999 Okada ....................................... 365/63

*Primary Examiner*—A. Zarabian
*Attorney, Agent, or Firm*—Renner, Otto, Boisselle & Sklar LLP

[57] ABSTRACT

A semiconductor memory includes a plurality of memory cells; and an access section for accessing a memory cell, among the plurality of memory cells, corresponding to a row address and a column address. The plurality of memory cells include at least one first memory cell accessible at a first access speed and at least one second memory cell accessible at a second access speed which is higher than the first access speed. The at least one second memory cell is assigned to at least one specified column address.

15 Claims, 23 Drawing Sheets

FIG. 10

64M Byte Memory Map

| Address | Content |
|---|---|
| 3FFFFFF | From Group-D with 8 cycle burst |
| 3FFFFDF | From Group-C with 8 cycle burst |
| 3FFFFBF | From Group-B with 8 cycle burst |
| 3FFFF9F | From Group-A with 8 cycle burst |
| 3FFFF7F | From Group-D with 8 cycle burst |
| 3FFFF5F | ⋮ |
| 000009F | From Group-A with 8 cycle burst |
| 000007F | From Group-D with 8 cycle burst |
| 000005F | From Group-C with 8 cycle burst |
| 000003F | From Group-B with 8 cycle burst |
| 000001F | From Group-A with 8 cycle burst |
| 0000000 | |

← 32M Byte (128 bit) →

FIG. 15 Relationship between logical address and physical address in one word line (1024 bits)

FIG. 21

64M Byte Memory Map

| Address | |
|---|---|
| 3FFFFFF | From Group-D with 8 cycle burst |
| 3FFFFDF | From Group-C with 8 cycle burst |
| 3FFFFBF | From Group-B with 8 cycle burst |
| 3FFFF9F | From Group-A with 8 cycle burst |
| 3FFFF7F | From Group-D with 8 cycle burst |
| 3FFFF5F | ⋮ |
| 000009F | From Group-A with 8 cycle burst |
| 000007F | From Group-D with 8 cycle burst |
| 000005F | From Group-C with 8 cycle burst |
| 000003F | From Group-B with 8 cycle burst |
| 000001F | From Group-A with 8 cycle burst |
| 0000000 | |

← 32 Byte (128 bit) →

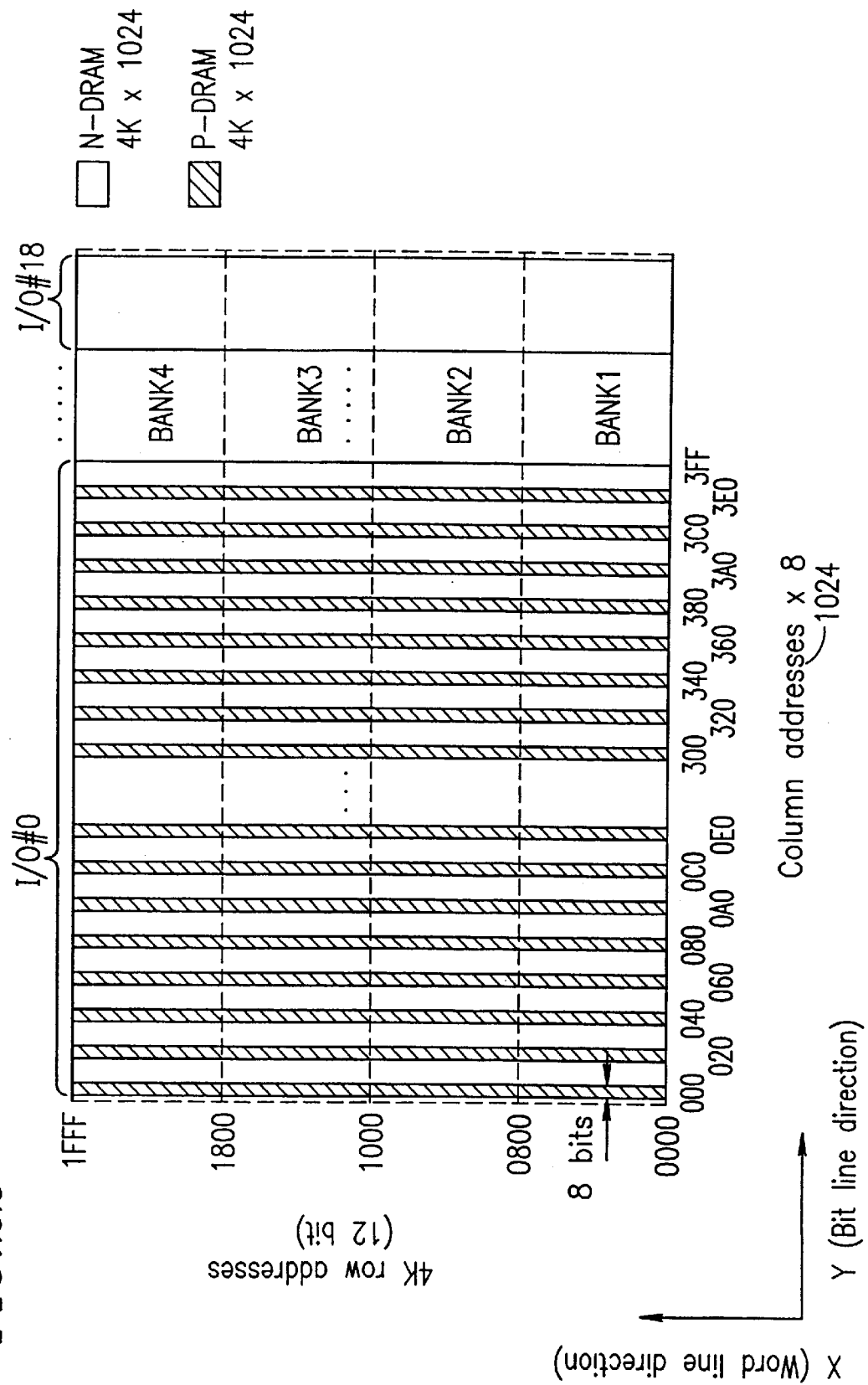

SEMICONDUCTOR MEMORY AND MEMORY SYSTEM

BACKGROUND OF THE INVENTION

1. Field of the Invention

The present invention relates to a semiconductor memory including a plurality of memory cells, each of which is designated using a row address and a column address, and to a memory system including the same.

2. Description of the Related Art

A representative semiconductor memory in which a memory cell to be accessed among a plurality of memory cells is designated using a row address and a column address is a dynamic random access memory (DRAM). A DRAM has a feature that an access to a first column address which is designated first after a row address is designated (hereinafter, such an access will be referred to as a "row access") is performed at a relatively low speed and that an access to a column address subsequent to the first column address (hereinafter, such an access will be referred to as a "column access") is performed at a relatively high speed. Such a feature is based on the fact that an active state of a word line corresponding to a row address is time-consuming, but once the word line is activated, memory cells connected to the word line can be accessed at a relatively high speed.

For example, in the case where a DRAM is used as the main memory of a personal computer (PC), a memory controller performs one row access to the DRAM and then performs 3 or 7 column accesses (so-called page access). Thus, the access speed in a second cycle and later cycles is raised. A row access is performed in response to a desired row address and a desired column access. Column accesses are performed by sequentially changing column addresses while retaining the row address unchanged. Such row and column accesses are performed for line fill of an L1 or L2 cache.

After 4 or 8 cycles of accesses to the DRAM are completed, a memory controller changes the state of the word line corresponding to the row address from the active state into an inactive state. Then, the memory controller waits for the next access request to the main memory.

As methods for accessing a memory cell at a high speed, the following two are most commonly known.

According to a first method, data for all the column addresses corresponding to a plurality of row addresses are stored in an SRAM. This method is proposed by Enhanced Memory Systems Inc.

A DRAM adopting the first method can have, for example, four SRAM caches. Each of the four SRAM caches can store data for all the column addresses corresponding to a row address (hereinafter, referred to as "one-page data"). Accordingly, the DRAM can store 4-page data corresponding to four row addresses using the four SRAM caches.

In this manner, the first access of the 4 to 8 cycles which is generated for each cache line fill is performed at a higher speed as long as the access is performed to data for several pages stored in the SRAM caches.

According to a second method, a plurality of memory cells are divided into a plurality of banks, and the plurality of banks are independently accessed. This method is adopted in synchronous DRAMs and Rambus DRAMs which are being actively developed today.

A DRAM adopting the second method can have, for example, 8 or 16 banks. Each bank can hold one-page data by a sense amplifier. Accordingly, by maintaining the word line corresponding to the row address active, the access to the word line is made page access. As a result, the access speed to the first column address in a cache fill cycle is raised.

The above-described two methods both have a disadvantage in that the row access performed to read one-page data is too slow to significantly improve the memory performance.

SUMMARY OF THE INVENTION

According to a first aspect of the invention, a semiconductor memory includes a plurality of memory cells; and an access section for accessing a memory cell, among the plurality of memory cells, corresponding to a row address and a column address. The plurality of memory cells include at least one first memory cell accessible at a first access speed and at least one second memory cell accessible at a second access speed which is higher than the first access speed. The at least one second memory cell is assigned to at least one specified column address.

In one example of the invention, at least one first memory cell is a DRAM cell and the at least one second memory cell is an SRAM cell.

In one example of the invention, the at least one column address indicates a leading address of all of a plurality of access units corresponding to the row address.

In one example of the invention, the plurality of memory cells are divided into a plurality of banks.

In one example of the invention, the at least one column address indicates a leading address of a selected address unit among the plurality of access units corresponding to the row address.

In one example of the invention, information corresponding to the at least one specified column address is input to the semiconductor memory simultaneously with the row address.

In one example of the invention, the access section starts accessing one of the at least one second memory cell while precharging one of the at least one first memory cell.

In one example of the invention, the at least one first memory cell and the at least one second memory cell have an identical structure.

In one example of the invention, a memory array is divided into at least a first sub array and a second sub array. The first sub array includes the at least one first memory cell, and the second sub array includes the at least one second memory cell. At least one specified column address in the first sub array is assigned to the at least one second memory cell in the second sub array.

According to a second aspect of the invention, a memory system includes a semiconductor memory; and a memory controller for controlling the semiconductor memory. The semiconductor memory includes a plurality of memory cells; and an access section for accessing a memory cell, among the plurality of memory cells, corresponding to a row address and a column address. The plurality of memory cells include at least one first memory cell accessible at a first access speed and at least one second memory cell accessible at a second access speed which is higher than the first access speed. The at least one second memory cell is assigned to at least one specified column address.

In one example of the invention, the at least one first memory cell is a DRAM cell and the at least one second memory cell is an SRAM cell.

In one example of the invention, the plurality of memory cells are divided into a plurality of banks.

According to the first aspect of the invention, at least one second memory cell (i.e., high-speed cell) is assigned to at least one specified column address. The specified column address is set to be a column address having a high probability of being designated first after the row address is designated. Thus, the probability that a row access is to the high-speed memory cell is raised. As a result, the performance of the semiconductor memory is enhanced.

In the case where the plurality of memory cells of the semiconductor memory are divided into a plurality of banks, the probability that a row access is to the high-speed memory cell is significantly raised. The reason for this is that a column address having a high probability of being designated first after the row address is designated can be restricted to a smaller number of column addresses, compared to the case of a single bank memory. As a result, the performance of the semiconductor memory is significantly enhanced.

According to the second aspect of the invention, at least one second memory cell (i.e., high-speed cell) is assigned to at least one specified column address. The specified column address is set to be a column address having a high probability of being designated first after the row address is designated. Thus, the probability that a row access is to the high-speed memory cell is raised. As a result, the performance of the semiconductor memory is enhanced, and thus the performance of the memory system is also enhanced.

In the case where the plurality of memory cells of the semiconductor memory of the memory system are divided into a plurality of banks, the probability that a row access is to the high-speed memory cell is significantly raised. The reason for this is that a column address having a high probability of being designated first after the row address is designated can be restricted to a smaller number of column addresses, compared to the case of a single bank memory. As a result, the performance of the memory system is significantly enhanced.

Thus, the invention described herein makes possible the advantages of providing a semiconductor memory having a significantly higher performance which improves the speed of row access performed before a column access, and a memory system including such a semiconductor memory.

These and other advantages of the present invention will become apparent to those skilled in the art upon reading and understanding the following detailed description with reference to the accompanying figures.

BRIEF DESCRIPTION OF THE DRAWINGS

FIG. 10 is a view illustrating a memory map of the memory system 3;

FIG. 21 is a view illustrating a memory map of the memory system 7000;

FIG. 22 is a conceptual view of a memory space of the memory system 7000.

DESCRIPTION OF THE PREFERRED EMBODIMENTS

Figure 1:
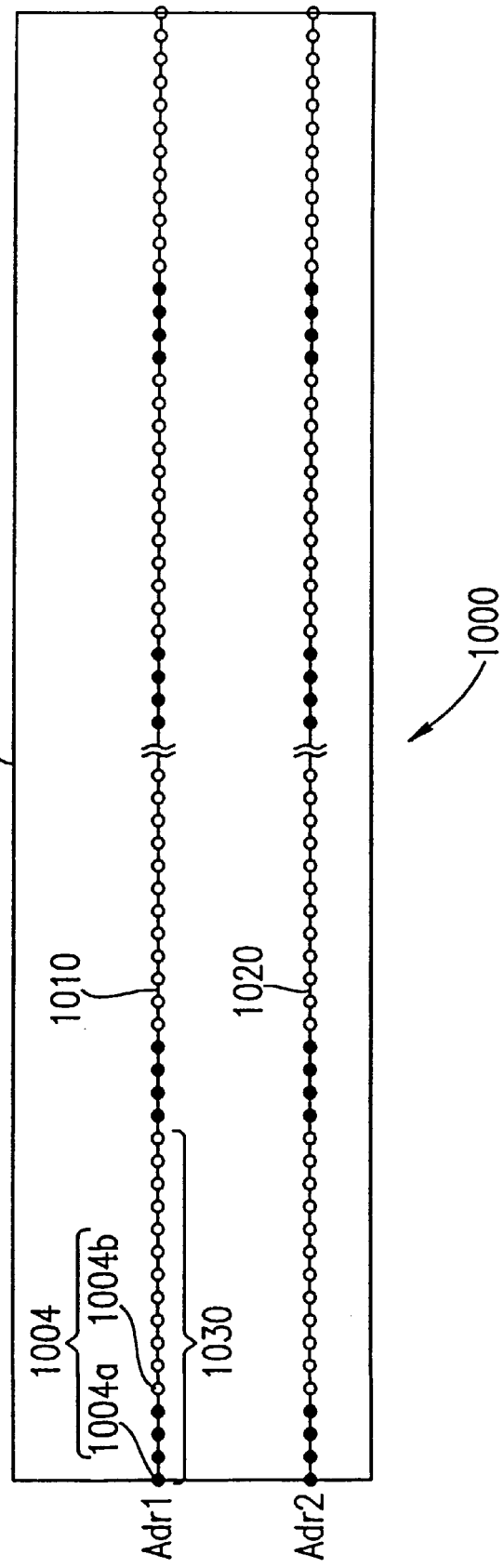
FIG. 1 is a view showing a structure of a memory cell array 1002 according to the present invention applied to a single bank memory 1000.
Figure 2:
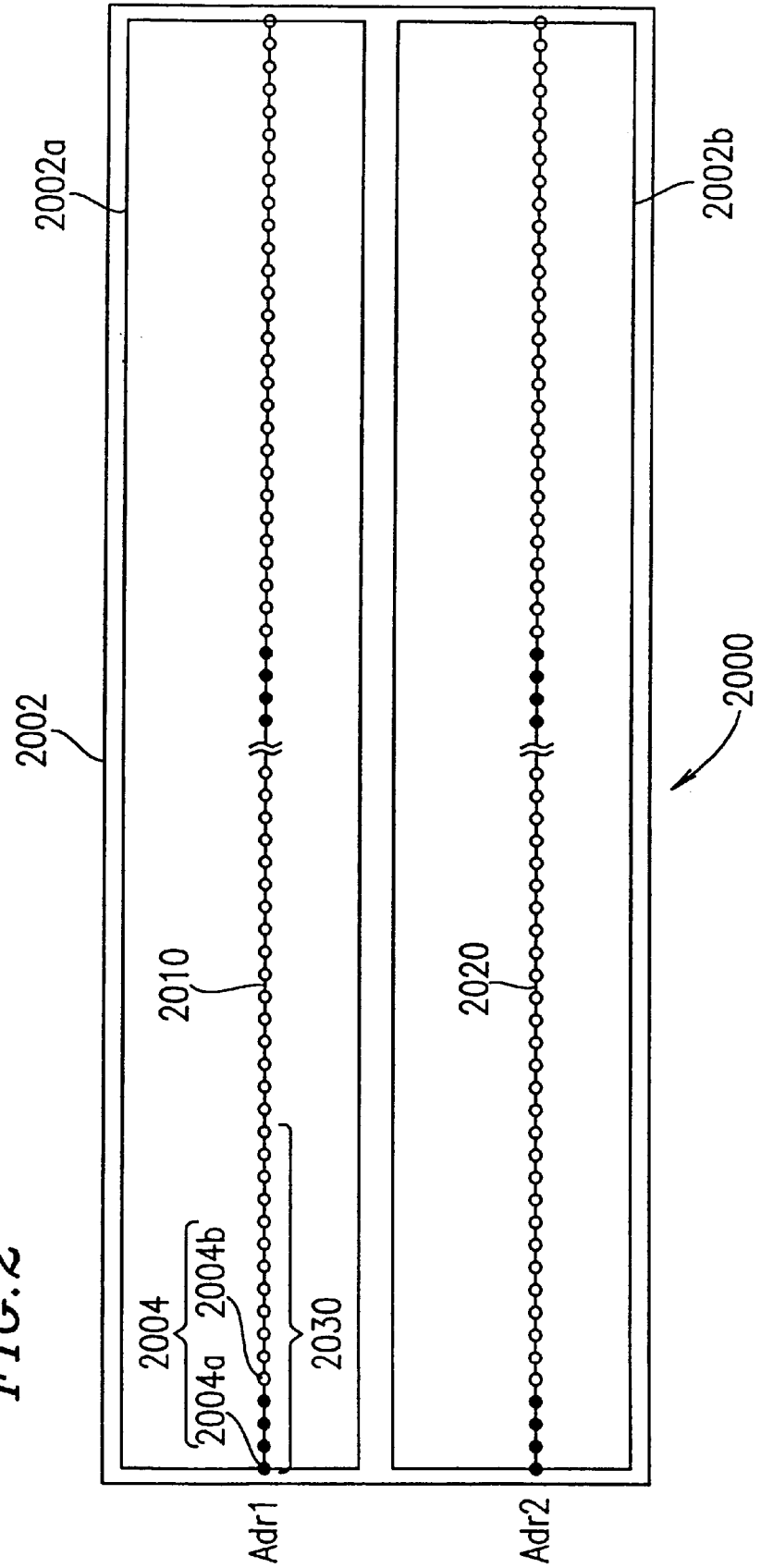
FIG. 2 is a view showing a structure of a memory cell array 2002 according to the present invention applied to a multiple bank memory 2000.

Referring to FIGS. 1 and 2, the principle of the present invention will be described.

FIG. 1 shows a structure of a memory cell array 1002 according to the present invention applied in a single bank memory 1000. The memory cell array 1002 includes a plurality of memory cells 1004. The plurality of memory cells 1004 are each connected to one of a plurality of word lines. The plurality of memory cells 1004 include at least one high-speed memory cell 1004a (represented in FIG. 1 by a black circle) and at least one low-speed memory cell 1004b (represented in FIG. 1 by a white circle). The high-speed memory cell 1004a can be, for example, an SRAM cell. The low-speed memory cell 1004b can be, for example, a DRAM cell.

In this specification, the high-speed memory cell 1004a is a memory cell which can be accessed at a higher speed than the low-speed memory cell 1004b, and the low-speed memory cell 1004b is a memory cell which can be accessed at a lower speed than the high-speed memory cell 1004a. In this specification, the terms "high-speed" and "low-speed" are used for representing relative speeds, not absolute speeds.

As shown in FIG. 1, the high-speed memory cells 1004*a* and the low-speed memory cells 1004*b* are arranged on one word line in a mixed state. The high-speed memory cells 1004*a* are arranged so as to correspond to a column address having a high probability of being designated first after the word line corresponding to the row address is activated.

The single bank memory 1000 cannot simultaneously maintain a plurality of word lines corresponding to a plurality of row addresses in an active state. Accordingly, for example, when a word line 1010 corresponding to a row address Adr1 is active, a word line 1020 corresponding to a row address Adr2 is inactive.

When an access to a memory cell 1004 on the word line 1020 is generated when the word line 101 is active, the word line 1010 needs to be inactivated and precharged before the word line 1020 is activated. This occurs, for example, when the active window on a display screen of a personal computer is changed from the window of a first application to the window of a second application.

When an access to a memory cell 1004 on the word line 1010 is generated again, the word line 1010 needs to be reactivated. This occurs, for example, when the active window on the display screen of the personal computer is returned from the window of the second application to the window of the first application.

As described above, in order to alternately activate two word lines, one word line which is in an active state needs to be inactivated before the other word line is activated. Since the column address which is designated first after the word line corresponding to the row address is activated has a high probability of being varied each time the word line is activated, a great many column addresses need to be prepared as candidates for the column address designated first after the row address is designated. Accordingly, the single bank memory 1000 requires a great many column addresses to be assigned for the high-speed memory cells 1004*a*. This increases the chip area and production cost of the single bank memory 1000.

It is preferable that a specified column address is set to indicate a leading address of each of a plurality of access units 1030 corresponding to each row address. An access unit 1030 is defined as a unit of bits which can be accessed preferably in an actual system. For example in a system using a personal computer in which memory cells corresponding to 16 consecutive addresses are generally accessed together as a set for the reasons of, for example, cache line fill, the access unit is set to be 16-bit. When the access unit 1030 of the single bank memory 1000 is 16-bit, it is preferable that a plurality of memory cells 1004 corresponding to a plurality of bits from the leading end of each of the plurality of access units 1030 are high-speed memory cells 1004*a*. In the example shown in FIG. 1, memory cells 1004 corresponding to 4 bits from the leading end of each access unit 1030 are high-speed memory cells 1004*a*.

FIG. 2 shows a structure of a memory cell array 2002 according to the present invention applied in a multiple bank memory 2000. The memory cell array 2002 includes a plurality of memory cells 2004. The plurality of memory cells 2004 are divided into a plurality of banks. In the example shown in FIG. 2, the plurality of memory cells 2004 are divided into two banks 2002*a* and 2002*b*. The plurality of memory cells 2004 are each connected to one of a plurality of word lines. The plurality of memory cells 2004 include at least one high-speed memory cell 2004*a* (represented in FIG. 2 by a black circle) and at least one low-speed memory cell 2004*b* (represented in FIG. 2 by a white circle). The high-speed memory cell 2004*a* can be, for example, an SRAM cell. The low-speed memory cell 2004*b* can be, for example, a DRAM cell.

The multiple bank memory 2000 can simultaneously maintain a plurality of word lines corresponding to a plurality of row addresses in an active state. In the example shown in FIG. 2, a word line 2010 corresponding to a row address Adr1 and a word line 2020 corresponding to a row address Adr2 are maintained in an active state simultaneously. As a result, when a memory cell on the word line 2010 and a memory cell on the word line 2020 are alternately accessed, it is not necessary to inactivate one of the word lines which is in an active state before the other word line is activated. This permits only a very small number of column addresses to be prepared as candidates for the column address which is designated first after the row address is designated. This is realized because the probability that the column address, designated first after the row address is designated, concentrates on a specified column address is higher in the multiple bank memory 2000 than the single bank memory 1000. Accordingly, the multiple bank memory 2000 requires a smaller number of column addresses to be assigned to the high-speed memory cells 2004*a*, compared to the single bank memory 1000.

It is preferable that a specified column address is set to indicate a leading address of at least one selected from a plurality of access units 2030 corresponding to each row address. An access unit 2030 is defined as a unit of bits which can be accessed preferably in an actual system. For example, when the access unit 2030 of the multiple bank memory 2000 is 16-bit long, it is preferable that a plurality of memory cells 2004 corresponding to a plurality of bits from the leading end of at least one selected from the plurality of access units 2030 are high-speed memory cells 2004*a*. In the example shown in FIG. 2, memory cells 2004 corresponding to 4 bits from the leading end of one selected access units 2030 are high-speed memory cells 2004*a*. In this manner, the high-speed memory cells 2004*a* are obtained by removing some of the plurality of high-speed memory cells 1004*a* included in the single bank memory 1000.

Hereinafter, the present invention will be described by way of illustrative examples with reference to the accompanying drawings.

Example 1

Figure 3:
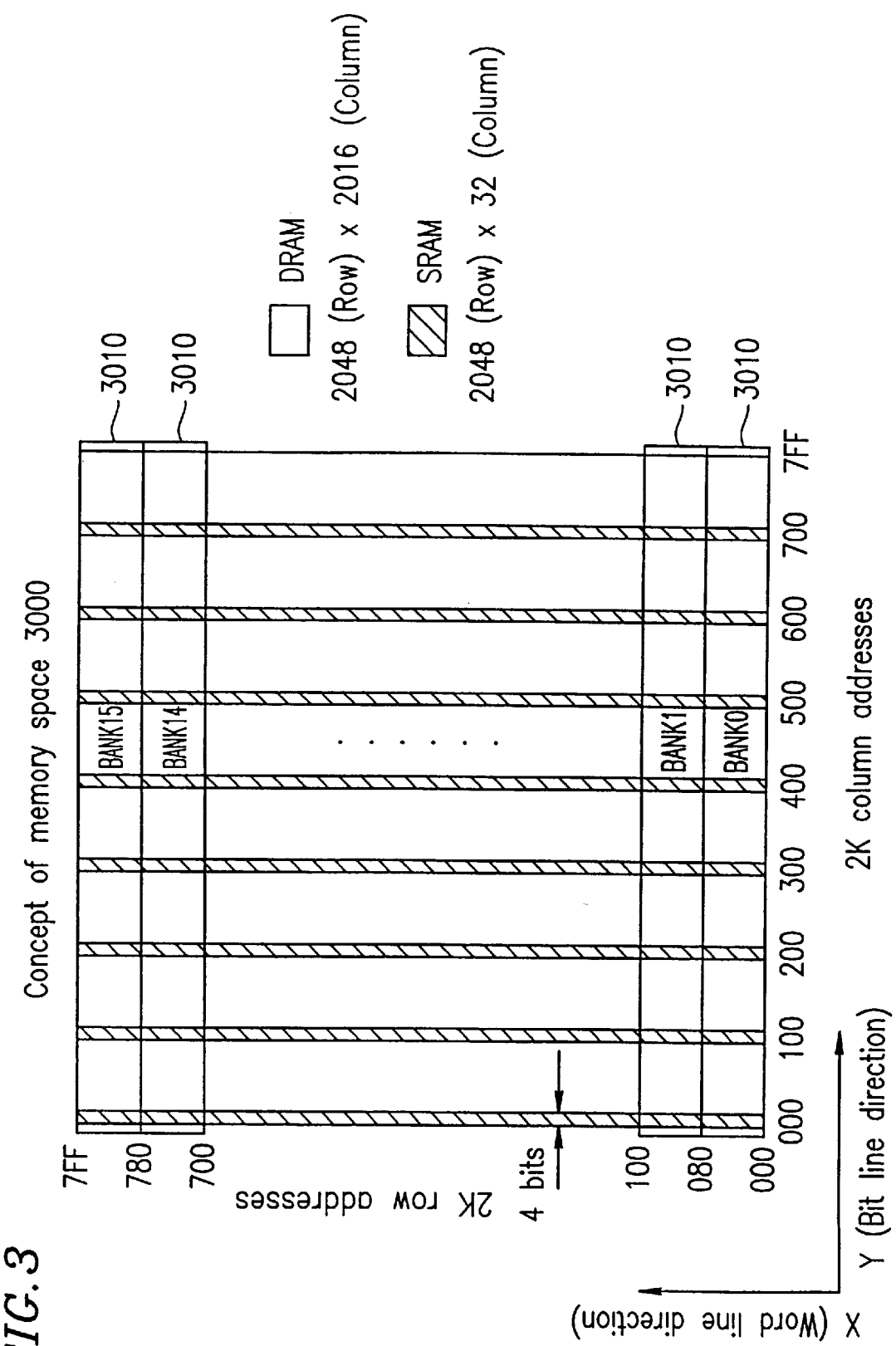
FIG. 3 is a conceptual view of a memory space 3000 of a semiconductor memory 1 in a first example according to the present invention.

FIG. 3 is a conceptual view of a memory space 3000 of a semiconductor memory 1 (FIG. 4) in a first example according to the present invention. The memory space 3000 is divided into 16 banks 3010, which are represented as BANK0 through BANK15 in FIG. 3. The 16 banks 3010 can be independently accessed.

The semiconductor memory 1 is formed of one chip and has a memory capacity of 2K×2K=4 Mbits. More particularly, the semiconductor memory 1 has a memory structure of 16 banks×7 bits (128 rows)×11 bits (2046 columns)×1-bit I/O (input/output) device. One-bit data is input to or output from the semiconductor memory 1.

The semiconductor memory 1 includes a plurality of memory cells. The plurality of memory cells includes at least one high-speed cell (e.g. SRAM cell) and at least one low-speed cell (e.g., DRAM cell).

As shown in FIG. 3, an X axis direction is a word line direction (the direction in which word lines are extended), and a Y axis direction is a bit line direction (the direction in which bit lines are extended). In the X axis direction, 2K row addresses hex000 to hex7FF are assigned. In the Y axis direction, 2K column addresses hex000 to hex7FF are assigned. Herein, "hex" refers to the hexadecimal representation.

In FIG. 3, the hatched area is an area assigned for high-speed memory cells (hereinafter, referred to as a "high-speed memory cell area"), and the remaining area is an area assigned for low-speed memory cells (hereinafter, referred to as a "low-speed memory cell area"). The high-speed memory cell area is realized by, for example, an SRAM having a memory structure of 2048 (row)×32 (column). The low-speed memory cell area is realized by, for example, a DRAM having a memory structure of 2048 (row)×2016 (column).

The high-speed memory cell area is formed in the memory space 3000 as a plurality of strip-like area sections. The strip-like area sections are formed in the X axis direction from the row address hex000 to the row address hex7FF and are arranged with specific spaces therebetween in the Y axis direction.

In the example shown in FIG. 3, 8 strip-like area sections are formed at every 256th address in the Y axis direction. The 8 strip-like area sections each include a width of 2048 bits in the X axis direction and a width of 4 bits in the Y axis direction. Alternatively, the width in the Y axis direction (bit width) can be 8 bits or 16 bits.

In the case where the column address designated first after the row address is designated matches a specified column address (i.e., hex000, hex100, hex200, hex300, hex400, hex500, hex600, or hex700), the accesses to the row address and the column address are performed at a high speed. The reason for this is that the column addresses included in the range of prescribed burst length bits (4 bits in the example shown in FIG. 3; alternatively can be 8 bits or 16 bits) from the specified column address are assigned to the high-speed memory cells.

While a high-speed memory cell is accessed, all the low-speed memory cells corresponding to the row address are activated. Accordingly, even when the target for accessing is changed from the high-speed memory cell to a low-speed memory cell, the low-speed memory cell can be accessed at a high speed.

The high-speed memory cells are arranged so that at least one of the high-speed memory cells is accessed as a "spot reliever" until all the low-speed memory cells corresponding to the row address are activated. Thus, continuous, uninterrupted accessing is realized.

A specified column address is pre-set so that the probability that the column address designated first after the row address is designated hits the specified column address. The performance of the semiconductor memory 1 is enhanced by setting the specified column address in this manner.

The probability that the column address designated first after the row address is designated hits the specified column address is significantly raised in a semiconductor memory in which a plurality of memory cells are divided into a plurality of banks and the active state of the word line corresponding to the row address is not inactivated at each cache line fill (i.e., multiple bank memory). The reason for this is that the probability that the column address designated first after the row address is designated concentrates on a specified column address is higher in a multiple bank memory than in a single bank memory. The specified column address is one of every 256th column addresses having a round numeral such as hex000, hex100, hex200, hex300, hex400, hex500, hex600 or hex700. Substantially all the row accesses start with a high-speed memory cell by setting such column addresses for high-speed memory cells. Thus, the performance of the semiconductor memory 1 is enhanced.

In a multiple bank memory, even when the target for accessing is changed from a first row address of a first bank to a second row address of a second bank, the active state of the word line corresponding to the first row address is maintained. Accordingly, when the target for accessing is returned from the second row address of the second bank to the first row address of the first bank, the access to the first row address is still performed at a high speed. Such a high-speed access is not realized in a single bank memory.

In the example shown in FIG. 3, the high-speed memory cells are provided at every 256th address along the Y axis direction. The present invention is not limited to such a structure. In the case where a larger number of high-speed memory cells are included, the high-speed memory cells can be provided at a smaller interval (e.g., at every 128 or 64th address). Alternatively, in the case where only a smaller number of high-speed memory cells are included, the high-speed memory cells can be provided at a larger interval (e.g., at every 512nd or 1024th address).

For example, a semiconductor memory having 8 banks has 8-page data which can be read or written at a high speed. A semiconductor memory having 16 banks has 16-page data which can be read or written at a high speed. It is considered to be in the following cases that the active state of the word line corresponding to the row address is inactivated and another word line is activated: when a sequential access is changed into a row access; when the application which is being executed is switched to another application; and when an access to the main memory from a peripheral device such as a hard disk drive (HDD) is started.

Figure 4:
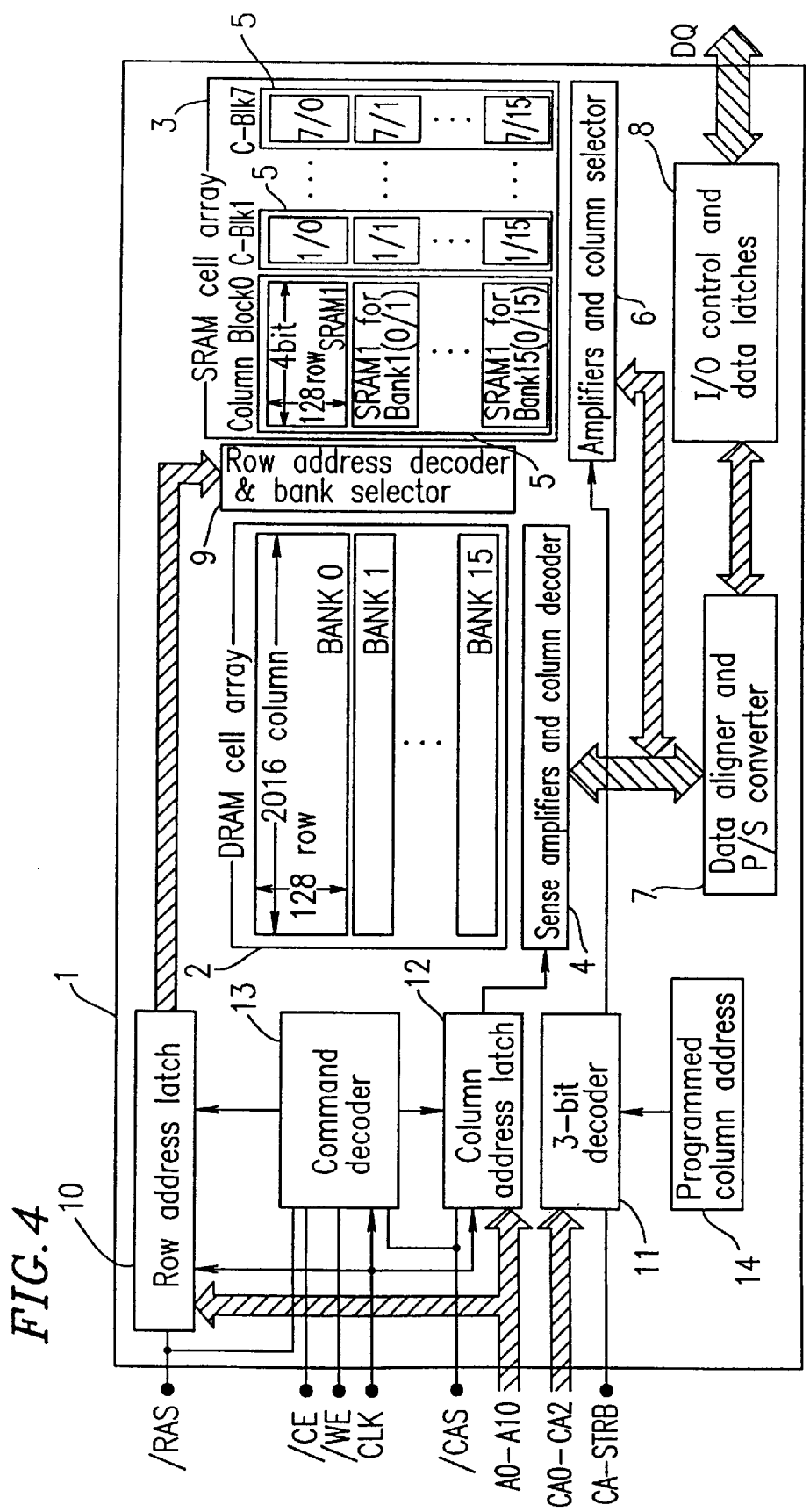
FIG. 4 is a block diagram showing a structure of the semiconductor memory 1.

FIG. 4 shows a structure of the semiconductor memory 1. The semiconductor memory 1 includes a DRAM cell array 2 having 2048 (row)×2016 (column) cells and an SRAM cell array 3 having 2048 (row)×32 (column) cells. The total memory capacity of the semiconductor memory 1 is 4194304 bit (4 Mbits).

The DRAM cell array 2 is divided into 16 banks (represented as BANK0 through BANK15 in FIG. 4). The 16 banks each have a memory structure of 128 (row)×2016 (column). The 16 banks can be independently accessed.

When a row address is designated, data for all the column addresses corresponding to the row address (i.e., 2016 bits corresponding to one-page data) is latched in a sense amplifier 4. Performing a row access requires time for amplifying the one-page data by the sense amplifier 4. Accordingly, it takes some time to latch the one-page data in the sense amplifier. Once the one-page data is latched in the sense amplifier 4, however, the data read and write are performed at a high speed.

One sense amplifier 4 is provided and can be activated for each of the 16 banks. Accordingly, the sense amplifiers 4 can latch 16-page data at the maximum.

The SRAM cell array 3 includes 8 column blocks 5 (represented as Column Block0, C-Blk1 through C-Blk7 in FIG. 4) corresponding to 8 specified column addresses (i.e., hex000, hex100, hex200, hex300, hex400, hex500, hex600 and hex700). The 8 column blocks 5 each have a memory structure of 2048 (row)×4 bits. The 8 column blocks 5 are each divided into 16 banks so as to correspon to the 16 banks of the DRAM cell array 2, respectively.

Figure 5:
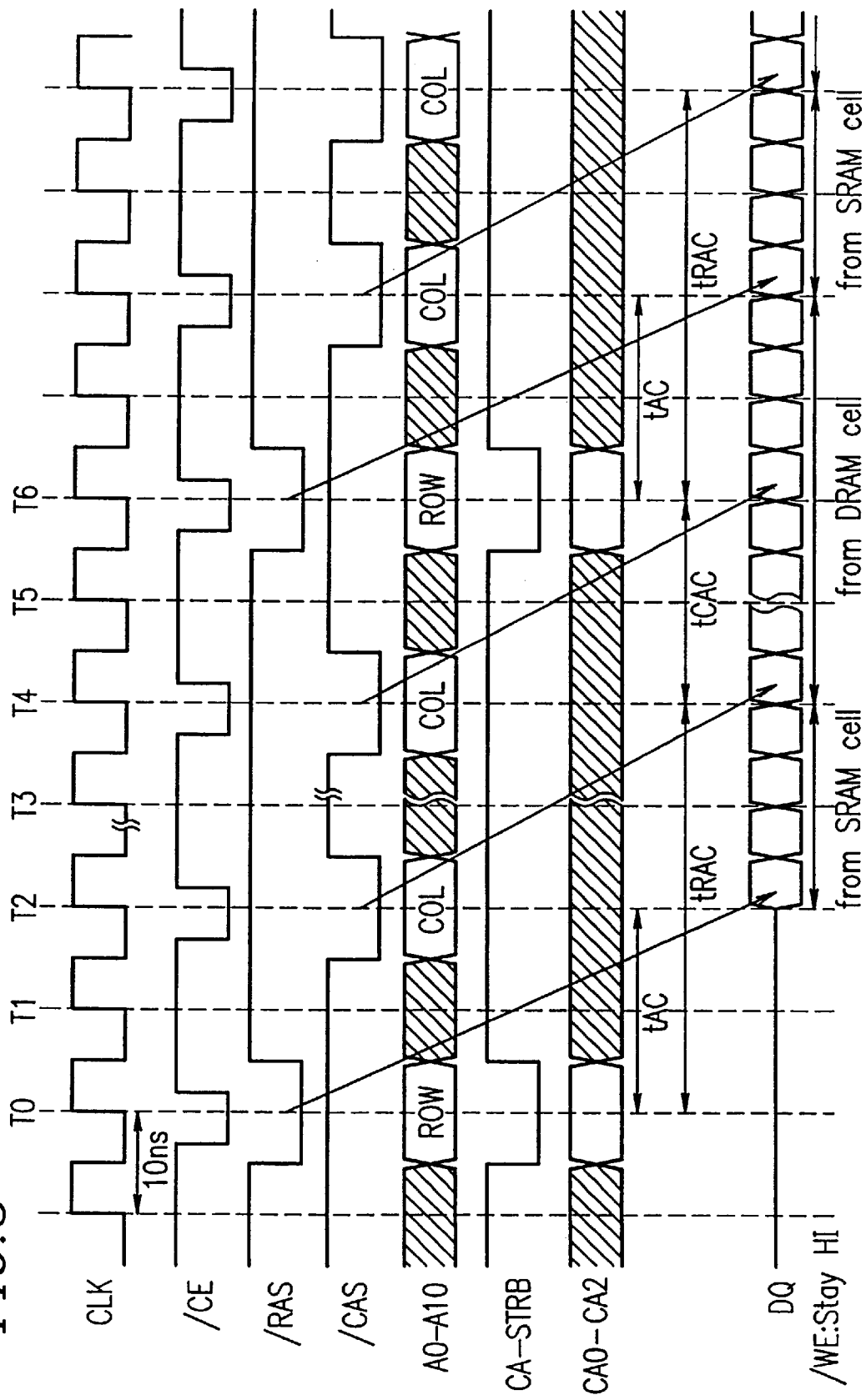
FIG. 5 is a timing diagram illustrating an exemplary operation of the semiconductor memory 1.

FIG. 5 shows operation timing of the semiconductor memory 1. Hereinafter, an exemplary operation of the semiconductor memory 1 will be described with reference to FIGS. 4 and 5.

Data is read from the semiconductor memory 1 in the following manner.

At time T0, a chip enable signal /CE is LOW and a RAS signal /RAS is LOW. A command decoder 13, in response to the LOW chip enable signal /CE and the LOW RAS signal /RAS, sends an enable signal to a row address latch 10. The row address latch 10, in response to the enable signal, takes in an address on an address bus (A0 through A10) as a row address and holds the row address.

Further at time T0, a control signal CA-STRB is LOW. A 3-bit decoder 11 receives 3-bit data from column address bus (CA0 through CA2) and decodes the 3-bit data. The 3-bit data is used to designate a specified column address to be accessed (hex000, hex100, hex200, hex300, hex400, hex500, hex600 or hex700).

The 3-bit data can have one of 8 values of bin000 through bin111. Herein, "bin" refers to the binary representation. The 8 values of the 3-bit data correspond to the specified column addresses, respectively. For example, the value bin000 of the 3-bit data corresponds to the specified column address hex000.

When the 3-bit data is bin000, the 3-bit decoder 11 outputs the column address hex000 to an amplifier and column selector 6. The amplifier and column selector 6 selects one of the 8 column blocks 5 in the SRAM array cell 3 in accordance with the column address output from the 3-bit decoder 11.

The relationship between the values of the 3-bit data input from the column address bus (CA0 through CA2) and the specified column addresses is stored in a programmed column address 14. The relationship can be altered by changing the contents of the programmed column address 14. For example, the relationship can be altered so that the value bin000 of the 3-bit data corresponds to the specified column address hex700. The programmed column address 14 is, for example, a nonvolatile memory.

A row address decoder and bank selector 9 activates one selected word line of one selected bank of the SRAM cell array 3 in accordance with the row address held in the row address latch 10. As a result, 4-bit data is output from the selected bank of the selected column block 5.

A data aligner and parallel/serial converter 7 converts the 4-bit parallel data output from the SRAM cell array 3 into 1-bit serial data. 1-bit serial data is sequentially output to a device external to the semiconductor memory 1 via I/O control and data latches 8.

The row address decoder and bank selector 9 activates the selected word line of the selected bank of the DRAM cell array 2 in accordance with the row address held in the row address latch 10.

At time T2, the chip enable signal /CE is LOW and a CAS signal /CAS is LOW. The command decoder 13, in response to the LOW chip enable signal /CE and the LOW CAS signal /CAS, sends an enable signal to a column address latch 12. The column address latch 12, in response to the enable signal, takes in an address on the address bus (A0 through A10) as a column address and holds the column address.

The sense amplifier and column decoder 4 selects 2016-bit data (one-page data) corresponding to the activated word line in the DRAM cell array 2 in accordance with the column address held in the column address latch 12. As a result, the selected 2016-bit data is output from the selected bank of the DRAM cell array 2.

The data aligner and parallel/serial converter 7 converts the 4-bit parallel data output from the SRAM cell array 3 into 1-bit serial data and aligns the serial data with the data output from the DRAM cell array 2. The aligned data is output to a device external to the semiconductor memory 1 via the I/O control and data latches 8.

The data from the SRAM cell array 3 is output at a higher speed than the data from the DRAM cell array 2. Accordingly, the first 4-bit data among the data output from the I/O control and data latches 8 is the data from the SRAM cell array 3, and the data subsequent to the first 4-bit data is the data from the DRAM cell array 2 (see FIG. 5).

The data from an SRAM cell can be output at time T2, which is 2 clocks after reference time T0. (The access time period to the SRAM cell is set to be 20 ns or less.) The data from a DRAM cell can only be output at time T4, which is 4 clocks after reference time T0. (The RAS access time period is set to be 20 ns or less.) In the semiconductor memory 1, a low-speed access to a DRAM cell in replaced with a high-speed access to an SRAM cell, regarding a specified column address. Thus, the overall performance of the semiconductor memory 1 can be enhanced.

Herein, the frequency of a clock signal CLK is 100 MHz since DRR (double data transfer) is assumed. In this case, one cycle of data is 5 ns, and it takes 20 ns to output 4-bit serial data. Where tRAC (RAS access time period)=40 ns, tCAC (CAS access time period)=20 ns, and tAC (SRAM access time period)=20 ns, the following operation is performed. Twenty nanoseconds after the row access starting timing (T0, T8), 4-bit data is output from the SRAM cell array 3, which takes 20 ns. Then, 60 ns after the row access starting timing, the next data is output from the DRAM cell array 2 at the timing of tRAC. Thereafter, by making the CAS signal /CAS LOW every 20 ns, data is output by the cycle of tCAC (20 ns). As a result, the continuous, uninterrupted data output as shown in FIG. 5 is realized.

Data is written into the semiconductor memory 1 in the following manner.

The I/O control and data latches 8 latch the data to be written. The data latched in the I/O control and data latches 8 is written in the DRAM cell array 2 or the SRAM cell array 3 in accordance with the column address. When the column address matches the specified column address, the data is written in the SRAM cell array 3. Otherwise, the data is written in the DRAM cell array 2.

The semiconductor memory 1 is effective when the row address is changed relatively frequently and the column address designated first after the row address is designated matches the specified column address at a high probability. In fact, when a plurality of applications are being executed on operating software such as Windows® and the hard disk drive is frequently accessed, it is expected that the row address is changed relatively frequently and that the column addresses at which the applications are switched or data transfer from the hard disk drive is started concentrates on several specified column addresses. Such specified column addresses have, for example, round numerals such as hex000, hex1000 and the like. Accordingly, by assigning high-speed memory cells (e.g., SRAM cells) to such specified column addresses and assigning low-speed memory cells (e.g., DRAM cells) to the other column addresses, the overall access speed to the semiconductor memory 1 can be improved.

The semiconductor memory 1 has 16 banks. After the word line is activated, each of the 16 banks can hold one-page data by the sense amplifier and column decoder 4. Thus, the semiconductor memory 1, as a whole, can keep the 16-page data readable and writable at a high speed.

Accordingly, when the row address hits the row address corresponding to the word line activated in each bank, a high-speed access is realized even when the column address changes randomly as in the case of a conventional DRAM.

In the first example, information representing a specified column address is input to the 3-bit decoder 11 from the column address bus (CA0 through CA2) independently from the row address and the column address, and simultaneously with the row address. Such a system allows an SRAM cell to be selected at the time of row access, resulting in a high-speed access to the SRAM cell. It is not necessary to provide a special pin for inputting the information representing the specified column address. Such a special pin is not necessary, for example, when the information representing the specified column address is input using packet input used in a Rambus DRAM.

Example 2

Figure 6:
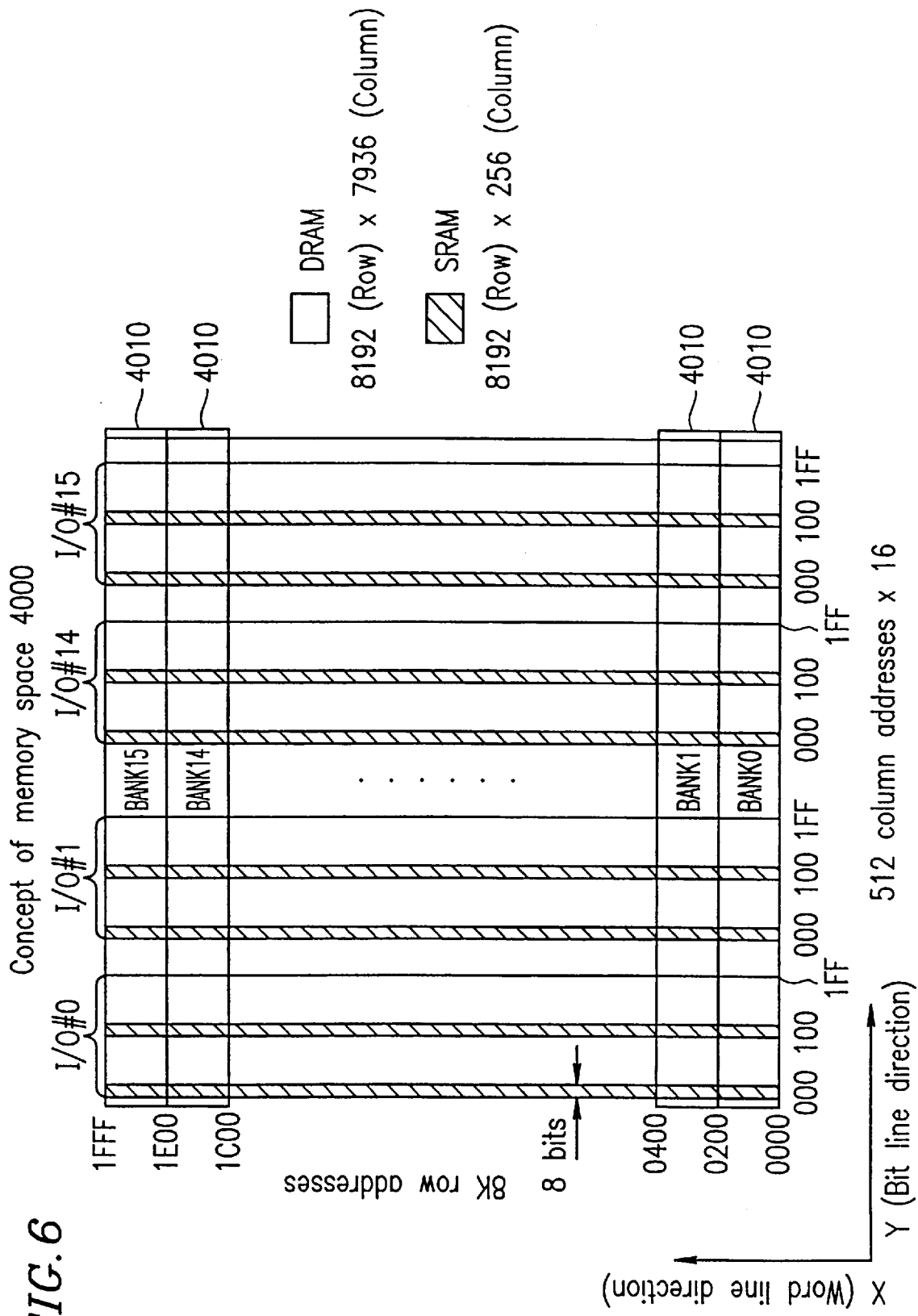
FIG. 6 is a conceptual view of a memory space 4000 of a semiconductor memory 101 in a second example according to the present invention.

FIG. 6 is a conceptual view of a memory space 4000 of a semiconductor memory 101 (FIG. 7) in a second example according to the present invention.

The memory space 4000 is divided into 16 banks 4010, which are represented as BANK0 through BANK15 in FIG. 6. The 16 banks 4010 can be independently accessed.

The semiconductor memory 101 has a memory capacity of 64 Mbits. More particularly, the semiconductor memory 101 has a memory structure of 16 banks×9 bits (512 rows)×9 bits (512 columns)×16-bit I/O device. The semiconductor memory 101 includes 16 I/O devices represented as I/O#0 through I/O#15 in FIG. 6. 1-bit data is input to or output from each I/O device.

In FIG. 6, the hatched area is a high-speed memory cell area assigned for high-speed memory cells (e.g., SRAM cell area), and the remaining area is a low-speed memory cell area assigned for low-speed memory cells (e.g., DRAM cell area).

The high-speed memory cell area includes a plurality of high-speed memory area sections, and two high-speed memory area sections are provided for each I/O device. Each high-speed memory area section has a width of 8 bits in the Y axis direction and corresponds to, for example, hex000 and hex100 among the 9-bit column address (hex000 through hex1FF; every 256th address).

Figure 7:
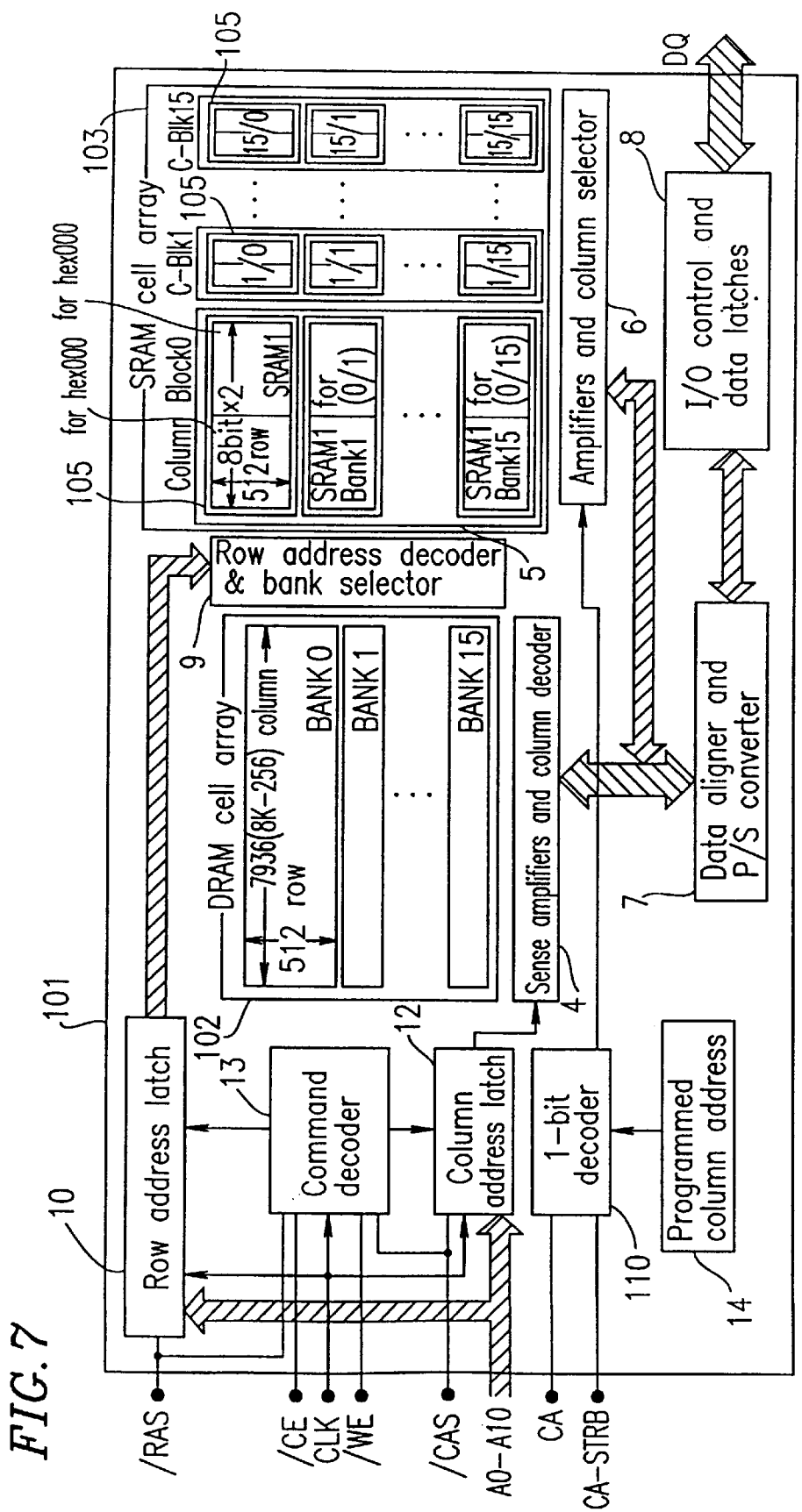
FIG. 7 is a block diagram showing a structure of the semiconductor memory 101.

FIG. 7 shows a structure of the semiconductor memory 101. The semiconductor memory 101 has the same structure as that of the semiconductor memory 1 shown in FIG. 4 except for a DRAM cell array 102, an SRAM cell array 103 and a 1-bit decoder 110. In FIG. 7, identical elements previously discussed with respect to FIG. 4 bear identical reference numerals and the descriptions thereof will be omitted.

The semiconductor memory 101 includes the DRAM cell array 102 having 8192 (row)×7936 (column) cells and the SRAM cell array 103 having 8192 (row)×256 (column) cells.

The DRAM cell array 102 is divided into 16 banks (represented as BANK0 through BANK15 in FIG. 7). The 16 banks each have a memory structure of 512 (row)×7936 (column). The 16 banks can be independently accessed.

The SRAM cell array 103 includes 16 column blocks 105 (represented as Column Block0, C-Blk1 through C-Blk15 in FIG. 7) corresponding to 16 I/O devices. The 16 column block 105 each have a memory structure of 512 (row)×8 (column) for the column address hex000 and a memory structure of 512 (row)×8 (column) for the column address hex100. Eight-bit consecutive data is assigned to the column address hex000, and 8-bit consecutive data is assigned to the column address hex100. Accordingly, the column block 105 has a data width of 8 bits×2=16 bits.

The 1-bit decoder 110 receives 1-bit data from the column address bus (CA) and decodes the 1-bit data. The 1-bit data is used to designate a specified column address to be accessed (hex000 or hex100 in the example shown in FIGS. 6 and 7). For example, the 1-bit decoder 110 outputs the specified column address hex000 to the amplifier and column selector 6 when the value of the 1-bit data is "0", and outputs the specified column address hex100 to the amplifier and column selector 6 when the value of the 1-bit data is "1". The amplifier and column selector 6 accesses the SRAM cell array 103 in accordance with the column address output from the 1-bit decoder 110. The relationship between the values of the 1-bit data input from the column address bus (CA) and the specified column addresses is stored in the programmed column address 14. The relationship can be altered by changing the contents of the programmed column address 14.

In the semiconductor memory 101, the burst length of data is 8 bits, and the frequency of a clock signal CLK is 100 MHz. Data is output every 5 ns in synchronization with the rising edge and the falling edge of the clock signal CLK.

Figure 8:
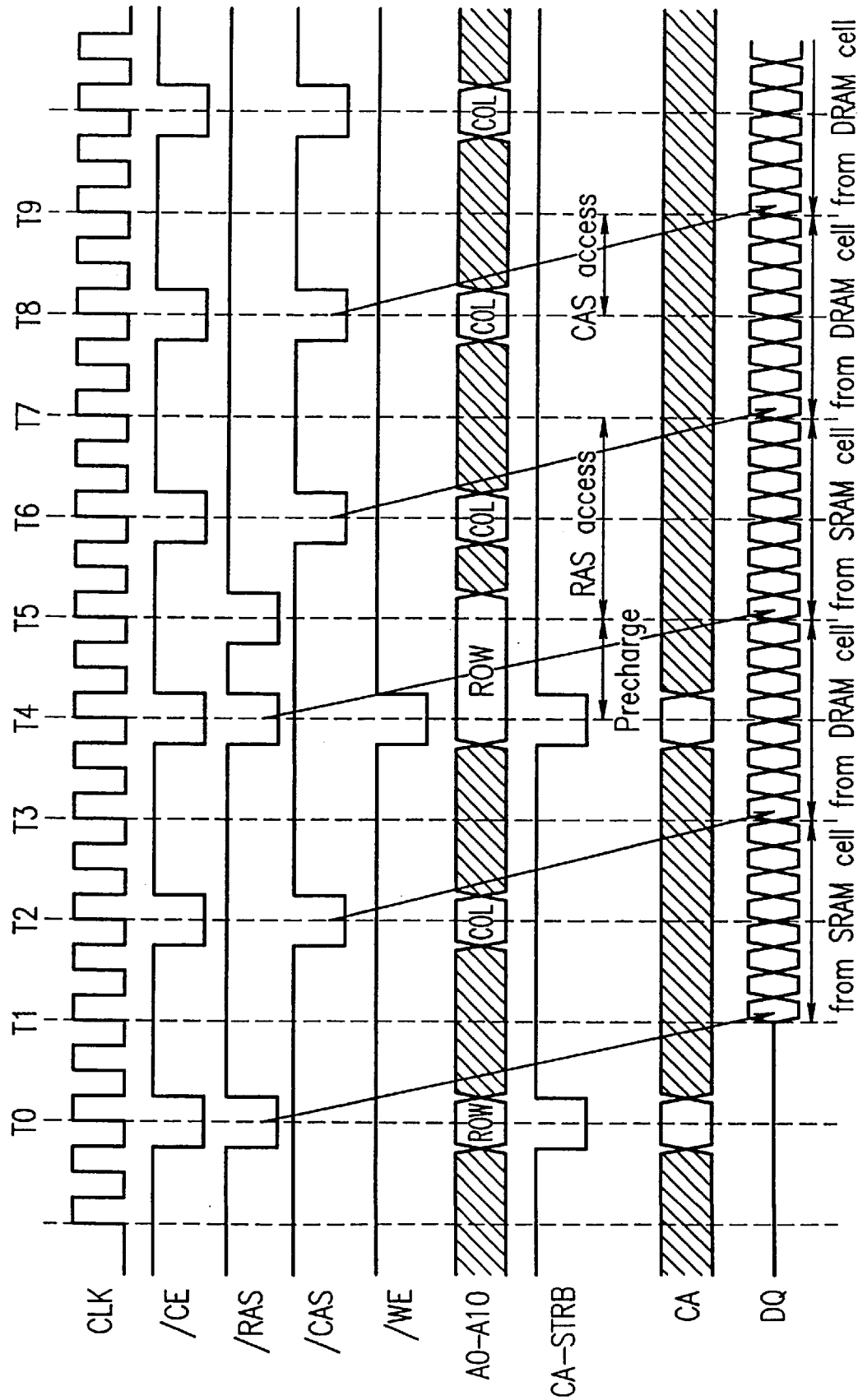
FIG. 8 is a timing diagram illustrating an exemplary operation of the semiconductor memory 101.

FIG. 8 shows operation timing of the semiconductor memory 101. Hereinafter, an exemplary operation of the semiconductor memory 101 will be described with reference to FIGS. 7 and 8.

Data is read from the semiconductor memory 101 in the following manner.

At time T4, a RAS signal /RAS is LOW, a CAS signal /CAS is HIGH, and a write enable signal /WE is LOW. In response to the LOW RAS signal /RAS, the HIGH CAS signal /CAS and the LOW write enable signal /WE, precharging of the word line in the DRAM cell array 102 corresponding to the row address input at the time T0 is started.

Further at time T4, a control signal CA-STRB is LOW. In response to the LOW control signal CA-STRB, 1-bit data representing a specified column address is input from the column address bus (CA) to the 1-bit decoder 110.

After the period for precharging the word line (20 ns) is passed, the RAS signal /RAS is made LOW again at time T5. In response to the LOW RAS signal /RAS, the word line in the SRAM cell array 103 corresponding to the row address input at time T5 is activated.

By inputting the 1-bit data representing the specified column address at time T4, data is allowed to be output at time T5, which is one cycle (20 ns) after time T4. The reason for this is that the SRAM cell array 103 can be accessed in parallel with the precharging of the word line in the DRAM cell array 102. Data from the SRAM cell array 103 is output every 5 ns in the form of 8-bit burst data. Therefore, the data output period is 40 ns.

When the DRAM cell array 102 is accessed, the data output period is 60 ns, which is the sum of tRP (RAS precharge time period=20 ns) and tRAC (RAS access time period=40 ns).

In the semiconductor memory 101, the precharge time period for precharging the word line (20 ns) and the period from the 1-bit data input until the start of the data output (20 ns) are overlapped, so that the data is output 20 ns earlier. By shortening the data output period in this manner, the continuous, uninterrupted data output as shown in FIG. 8 is realized.

The burst length of data and the cycle time (frequency of the clock signal CLK) can be appropriately selected in accordance with the design. Thus, continuous, uninterrupted data output is realized under any situation.

Example 3

Figure 9:
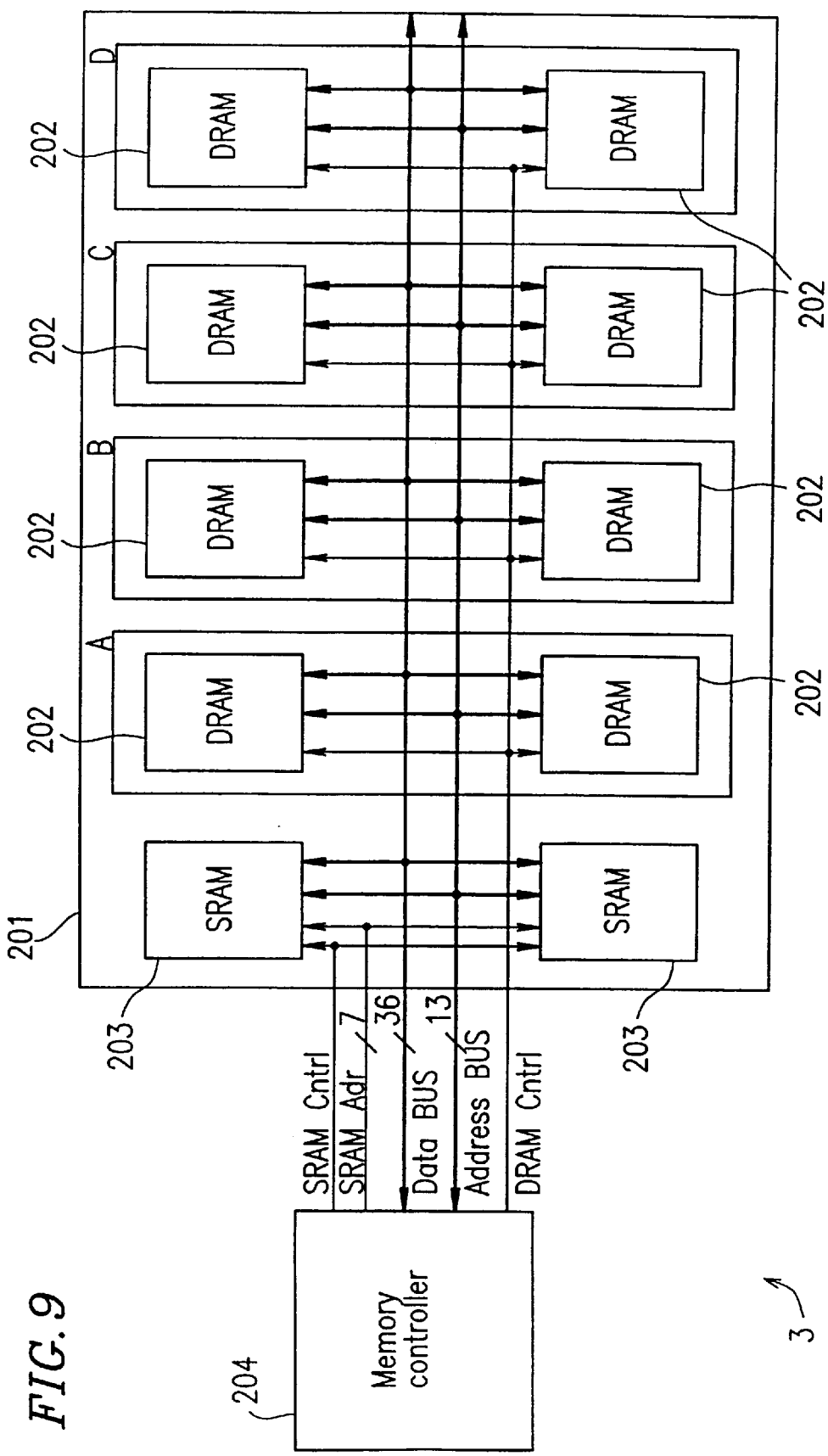
FIG. 9 is a block diagram showing a structure of a memory system 3 in a third example according to the present invention.

FIG. 9 shows a structure of a memory system 3 in a third example according to the present invention. The memory system 3 includes a memory module 201 and a memory controller 204 for controlling the memory module 201. The memory module 201 and the memory controller 204 are connected to each other via a transmission path for transmitting information (e.g., data bus or address bus).

The memory module 201 includes 2 SRAM devices 203 and 8 DRAM devices 202.

The SRAM device 203 each have a memory structure of 1 Mbit×18 bits and has a memory capacity of 18 Mbits. A 20-bit address is input to each SRAM device 203. In response to the address input, the SRAM device 203 outputs 8-bit data in synchronization with the clock signal CLK.

The DRAM devices 202 each have a memory structure of 4 banks×1 Mbit×18 bits and each has a memory capacity of 72 Mbits. A 13-bit address (banks and rows) and a 9-bit address (column) are input to each DRAM device 202 via a common address bus (13 bits). In response to the input address, the DRAM device 202 outputs 8-bit data in synchronization with the clock signal CLK.

In the memory module 201, data can be output from a plurality of DRAM devices 202 simultaneously, and thus the bit width of the data bus is 36 bits (32 bits for transmitting the data+4 bits for transmitting parity bits). Connected in parallel to the data bus are data pins of the two SRAM devices 203. Furthermore, data pins of every two DRAM devices 202 are connected in parallel. Four sets of DRAM devices 202 are connected in series.

The memory module 201 acts as a 64-Mbyte memory module. As shown in FIG. 10, a memory space of hex0000000 through hex3FFFFFF is assigned to the memory module 201. The memory space is covered with the DRAM devices 202 and the SRAM devices 203. To the DRAM devices 202, a row access is performed at a low speed. Accordingly, in the memory module 201, a row access is performed using the SRAM devices 203, and column accesses subsequent to the row access are performed using the DRAM devices 202.

In this manner, the memory module 201 uses the SRAM devices 203, instead of the DRAM devices 202, for performing an access to a specified column address which is time-consuming when performed by the DRAM devices 202, so as to improve the overall performance of the memory system 3.

The upper 13 bits of the 20-bit address input to each SRAM device 203 are connected to the address bus of the DRAM devices 202. The remaining 7 bits of the 20-bit address are assigned to prescribed column addresses of the DRAM devices 202. The lower 3 bits of the remaining 7 bits are related to determination of the first column address corresponding to the 8-bit burst data. The upper 4 bits of the remaining 7 bits are assigned, one to one, to 16 addresses provided at every 32nd bit (i.e., hex0000, hex0020, hex0040, hex0060 . . . hex01C0 and hex01D0).

Figure 11:
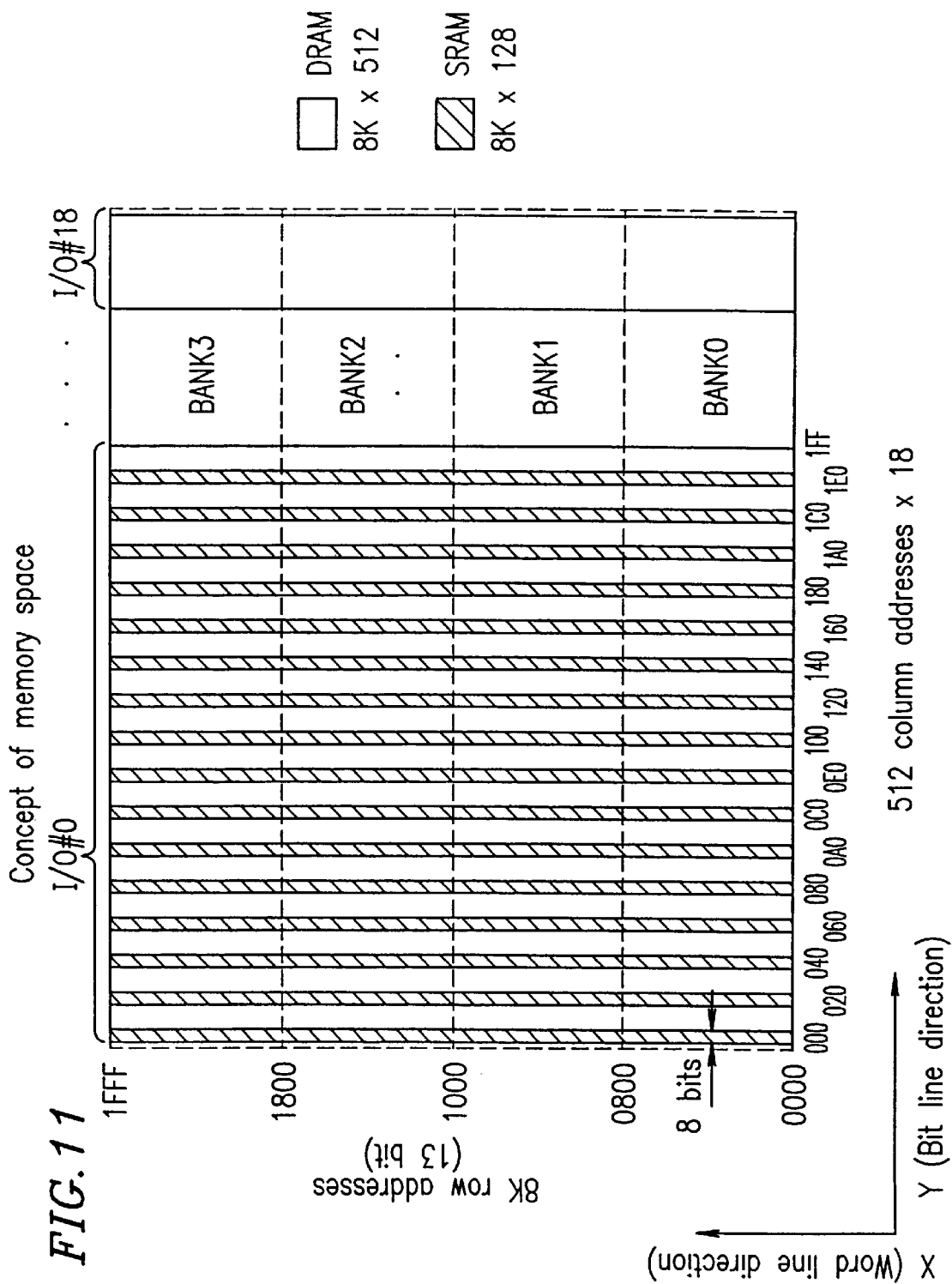
FIG. 11 is a conceptual view of a memory space of the memory system 3.

FIG. 11 shows how a part of the SRAM device 203 corresponds to one DRAM device 202. When the 9-bit column address of the DRAM device 202 hits one of the above-described 16 addresses, the control signals such as, for example, the chip enable signal /CE of the SRAM device 203 are activated. In this manner, the data stored in the hit addresses is read from the SRAM device 203, and given data is written in the hit addresses.

Figure 12:
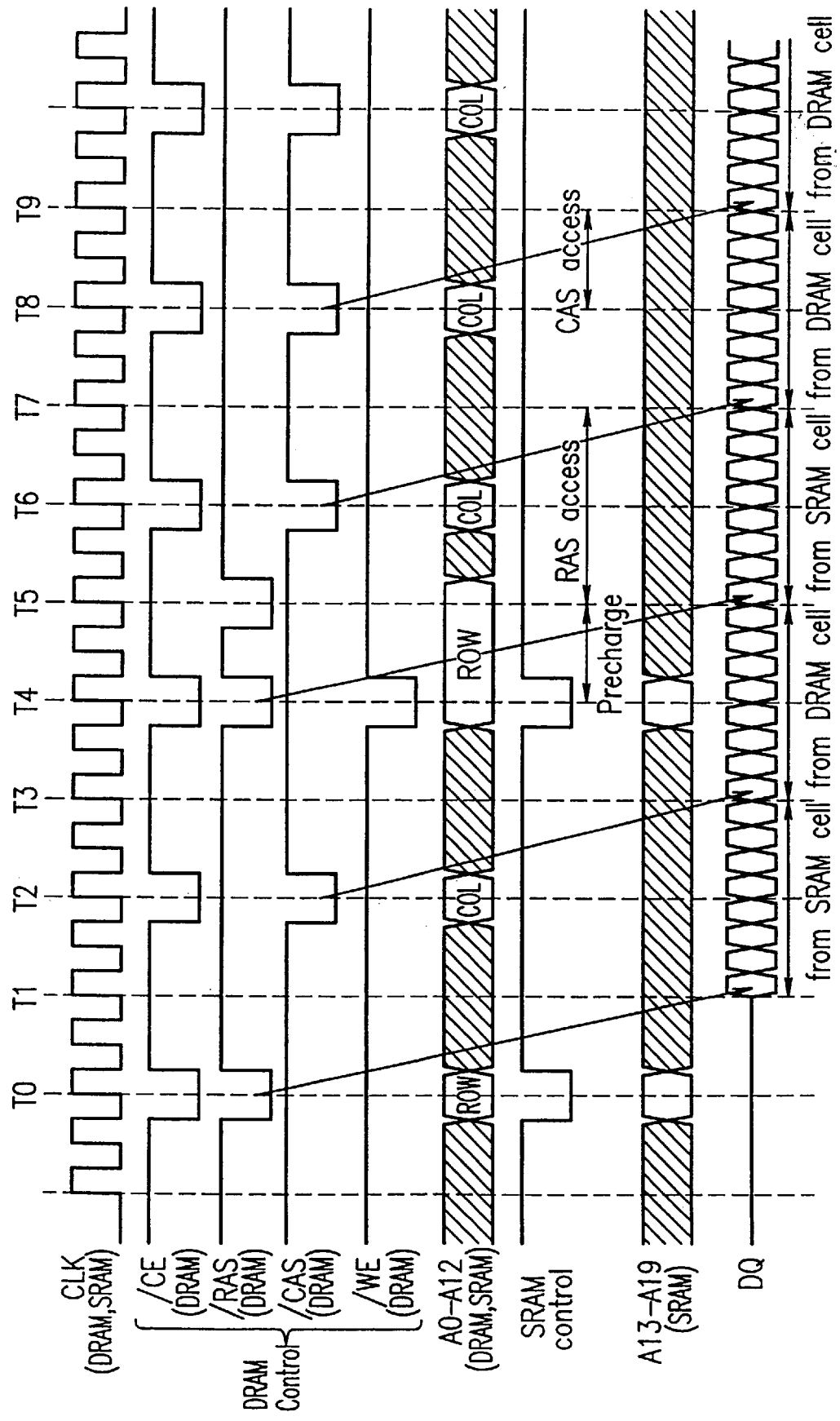
FIG. 12 is a timing diagram illustrating an exemplary operation of the memory system 3.

The continuous, uninterrupted data output as shown in FIG. 12 is realized by using the above-described 7-bit address as the address which is input from the column address bus (CA0 through CA2) shown in FIG. 4 and from the column address bus shown in FIG. 6 and using a control signal of the SRAM device 203 instead of the control signal CA-STRB.

An access to a specified column address in the DRAM device 202 (i.e., row access) is performed by an SRAM device 203 capable of high-speed accessing. Thus, the speed of row access is raised. Since the DRAM device 202 can be activated while accessing the SRAM device 203, the access is still performed at a high speed even when the target for accessing is changed from the SRAM device 203 to the DRAM device 202.

In the case of FIG. 10, where DRAM device groups (FIG. 9) A through D are assigned in a memory map, the bank conflict in the DRAM device 202 can be reduced.

The memory system 3 in the third example is especially effective in a personal computer or a work station in which a cache memory is built in and continuous data read and write are performed in the column address direction. The specified column address can be made programmable using, for example, a nonvolatile memory cell. Such a system allows the specified column address to be optimized for each of various applications. For example, the user can reset the specified column address so as to be suitable to a graphics application. In such a case, a semiconductor memory according to the present invention is applicable to a graphics application having no cache memory. Thus, a semiconductor memory according to the present invention is applicable to a wider range of uses.

Example 4

Figure 13:
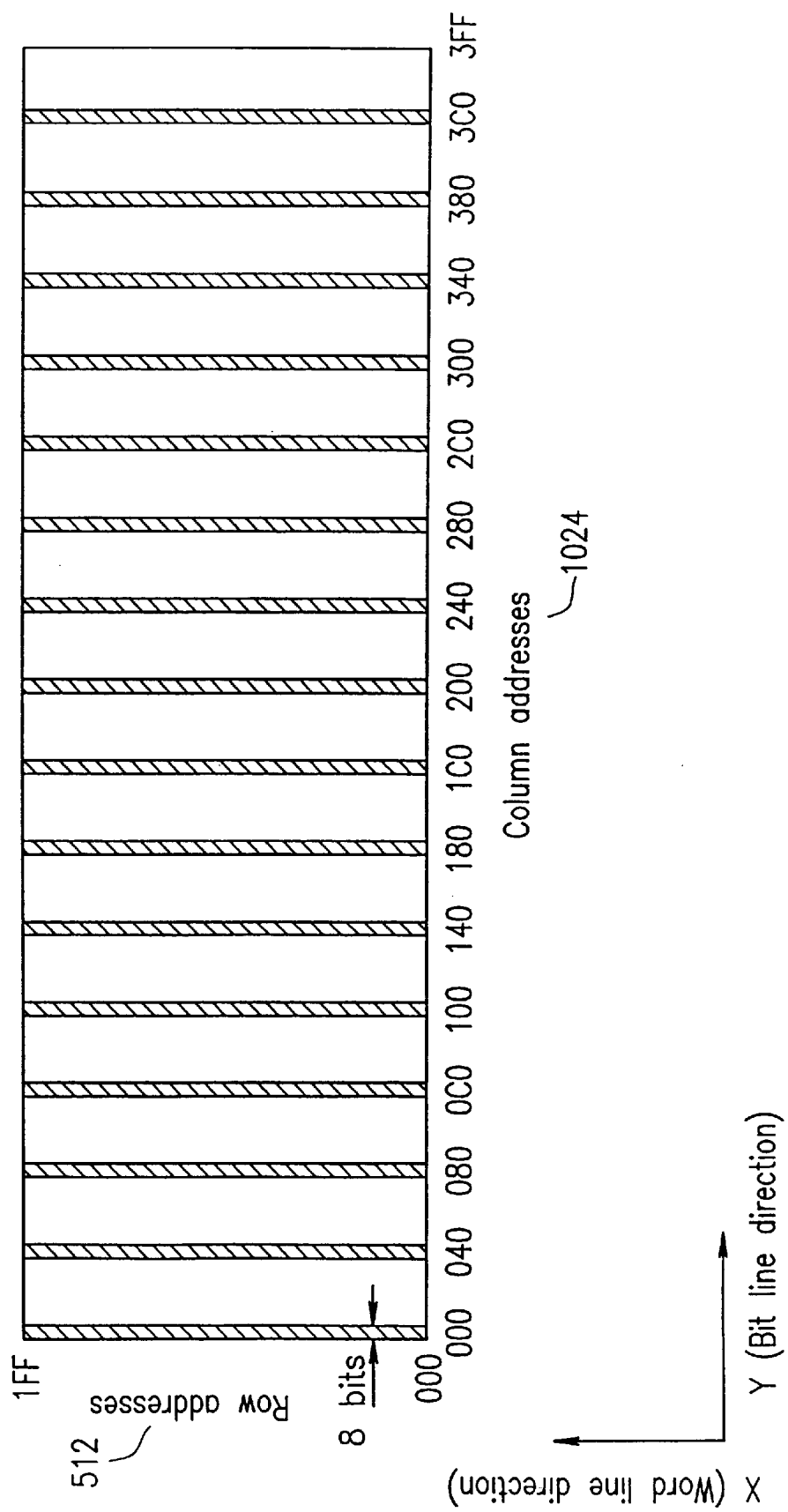
FIG. 13 is a conceptual view of a memory array space 5000 of a semiconductor memory 5001 in a fourth example according to the present invention.

FIG. 13 is a conceptual view of a memory array space 5000 of a semiconductor memory 5001 (FIG. 14) in a fourth example according to the present invention.

The semiconductor memory 5001 has a memory structure of 512 (row)×1024 (column)×1-bit I/O device. One-bit data is input to or output from the semiconductor memory 5001. The memory array space 5000 is divided into two sub arrays (i.e., a normal array and a prefetch array). The normal array and the prefetch can be independently activated and inactivated.

The normal array and the prefetch array each includes a plurality of memory cells. The plurality of memory cells included in the normal array and the plurality of memory cells included in the prefetch array have an identical structure. However, the memory cells included in the prefetch array are accessed at a higher speed than the memory cells included in the normal array. For example, the normal array and the prefetch array each include a plurality of DRAM cells.

A specified column address in the normal array is assigned to a memory cell in the prefetch array. Thus, the access to the specified column address in the normal array can be replaced with an access to a memory cell in the prefetch array.

The memory array 5001 can be divided into three or more sub arrays. In such a case, a specified column address in one sub array is assigned to memory cells in the other sub arrays.

Thus, the access to the specified column address in the one sub array can be replaced with an access to the memory cells in the other sub arrays.

In FIG. 13, the hatched area is an area assigned for prefetch array (hereinafter, referred to as a "prefetch array area"), and the remaining area is an area assigned for the normal array (hereinafter, referred to as a "normal array area"). The prefetch array area can be realized by, for example, an DRAM array having a memory structure of 64 (row)×1024 (column). The normal array area can be realized by, for example, a DRAM array having a memory structure of 512 (row)×896 (column).

The prefetch array area is formed in the memory array space 5000 as a plurality of strip-like area sections. The strip-like area sections are formed in the X axis direction from the row address hex000 to the row address hex1FF and are arranged with specific spaces in the Y axis direction.

In the example shown in FIG. 13, 16 strip-like area sections are formed at every 64th address in the Y axis direction. The 16 strip-like area sections each include a width of 512 bits in the X axis direction and a width of 8 bits in the Y axis direction.

In the case where the column address designated first after the row address is designate matches a specified column address (i.e., hex000, hex040, . . . or hex3C0), the accesses to the row address and the column address are performed at a high speed. The reason for this is that the column addresses included in the range of prescribed burst length bits (8 bits in the example shown in FIG. 13;) from the specified column address are assigned to the memory cells in the prefetch array.

While a memory cell in the prefetch array is accessed, all the memory cells in the normal array corresponding to the row address are activated. Accordingly, even when the target for accessing is changed from the memory cell in the prefetch array to a memory cell in the normal array, the memory cell in the normal array can be accessed at a high speed.

The prefetch array and the normal array are structured so that at least one of the memory cells in the prefetch array is accessed as a "spot reliever" until all the memory cells in the normal array corresponding to the row address are activated. Thus, continuous, uninterrupted accessing is realized.

A specified column address in the normal array is pre-set so that the probability that the column address, designated first after the row address is designated, hits the specified column address. The performance of the semiconductor memory 5001 is enhanced by setting the specified column address in the normal array in this manner.

The probability that the column address designated first after the row address is designated hits the specified column address is significantly raised in a semiconductor memory in which a plurality of memory cells are divided into a plurality of banks and the active state of the word line corresponding to the row address is not inactivated at each cache line fill (i.e., multiple bank memory). The reason for this is that the probability that the column address designated first after the row address is designated concentrates on a specified column address is higher in a multiple bank memory than in a single bank memory. The specified column address is one of every 64th column addresses having a round numeral such as hex000, hex040, . . . or hex3C0. Substantially all the row accesses start with a memory cell in the prefetch array by setting such column addresses for memory cells in the prefetch array. Thus, the performance of the semiconductor memory 5001 is enhanced.

In a multiple bank memory, even when the target for accessing is changed from a first row address of a first bank to a second row address of a second bank, the active state of the word line corresponding to the first row address is maintained. Accordingly, when the target for accessing is returned from the second row address of the second bank to the first row address of the first bank, the access to the first row address is still performed at a high speed. Such a high-speed access is not realized in a single bank memory.

In the example shown in FIG. 13, the strip-like area sections of the prefetch array are provided at every 64th address along the Y axis direction. The present invention is not limited to such a structure. The strip-like area sections can be provided at a smaller interval or at a larger interval (e.g., at every 128th or 256th address).

When a row address corresponding to a word line which is not activated among a plurality of word lines included in the prefetch array is designated, a high-speed access to the memory cells in the prefetch array cannot be expected. In the prefetch array, however, a word line corresponding to a row address in the vicinity of the memory cell which is currently activated is activated. Accordingly, in an actual system, the probability that the row address corresponding to the word line which is not activated is designated in the prefetch array is restricted low, thus presenting substantially no problem.

For example, a semiconductor memory having 8 banks has 8-page data which can be read or written at a high speed. A semiconductor memory having 16 banks has 16-page data which can be read or written at a high speed. It is considered to be in the following cases that the active state of the word line corresponding to the row address is inactivated and another word line is activated: when a sequential access is changed into a row access; when the application which is being executed is switched to another application; and when an access to the main memory from a peripheral device such as a hard disk drive (HDD) is started.

Figure 14:
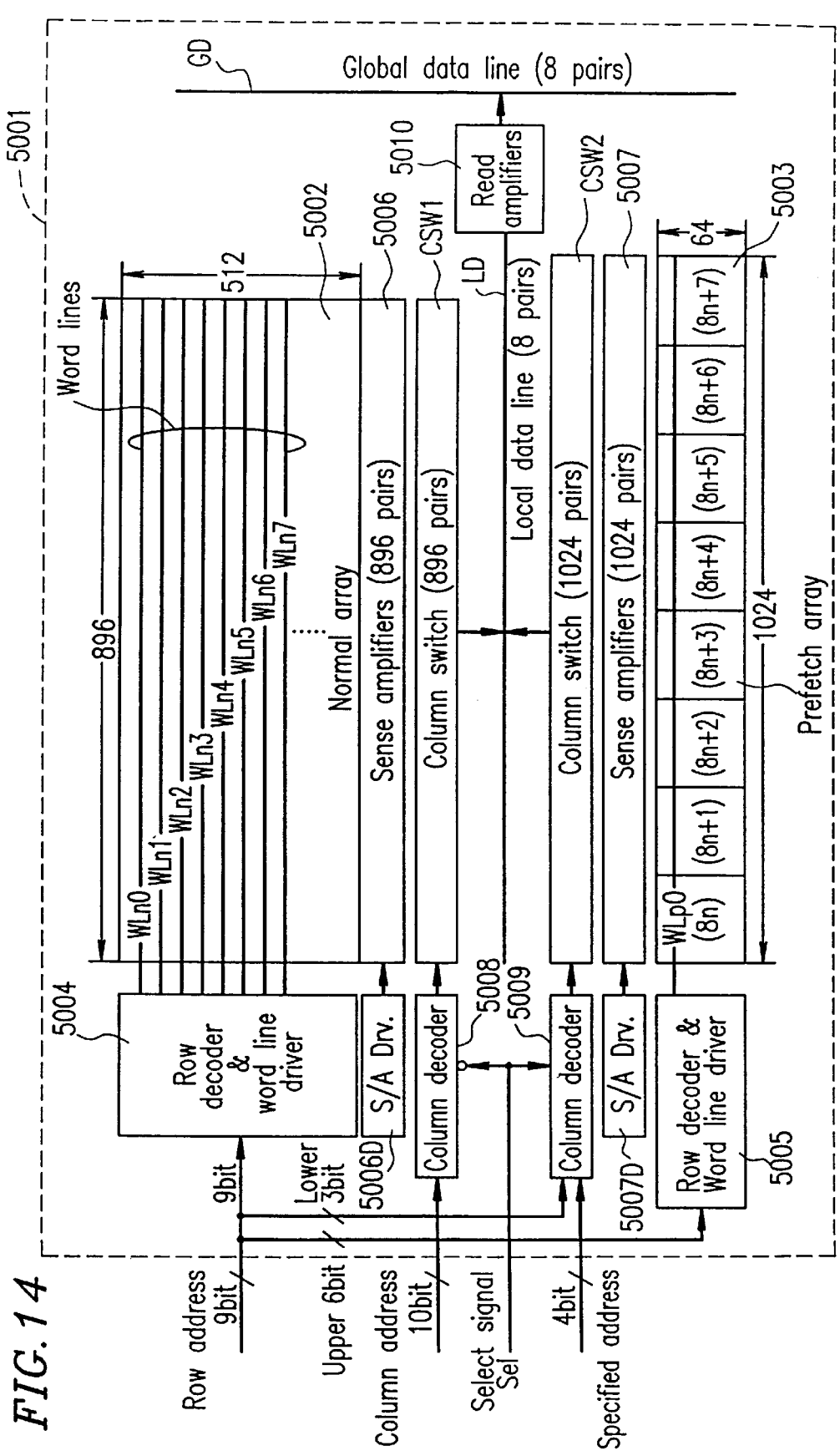
FIG. 14 is a block diagram showing a structure of the semiconductor memory 5001.

FIG. 14 shows a structure of the semiconductor memory 5001. The memory array of the semiconductor memory 5001 is divided into a normal array 5002 having 512 (row)×896 (column) cells and a prefetch array 5003 having 64 (row)×1024 (column) cells.

One word line in the prefetch array 5003 corresponds to 8 word lines in the normal array 5002. For example, one word line WLp0 in the prefetch array 5003 is divided into 8 sections WLp0(8n) through WLp0(8n+7) so as to correspond to 8 lines WLn0 through WLn7 in the normal array 5002.

Specified column addresses (hex000, hex040, . . . and hex3C0) corresponding to the word line WLn0 in the normal array 5002 are assigned to 16 memory cells in the word line section WLp0(8n) of the word line WLp0 in the prefetch array 5003. The 16 memory cells each have a width of 8 bits. Accordingly, the word line section WLp0(8n) of the word line WLp0 has a bit width of 128(=8×16) bits.

In the same manner, specified column addresses (hex000, hex040, . . . and hex3C0) corresponding to the word line WLn1 in the normal array 5002 are assigned to 16 memory cells in a word line section WLp0(8n+1) of a word line WLp0 in the prefetch array 5003. The 16 memory cells each have a width of 8 bits. Accordingly, the word line section WLp0(8n+1) of the word line WLp0 has a bit width of 128(=8×16) bits.

In this manner, specified column addresses provided at every 64th bit from hex000 and are assigned to the memory cells in the prefetch array 5003. Accordingly, data corresponding to these specified column addresses are stored in a plurality of memory cells corresponding to one word line in the prefetch array 5003. The prefetch array 5003 has a bit width of 1024(=128×8).

Hereinafter, a basic operation of the semiconductor memory 5001 will be described.

First, a 9-bit row address is input to the semiconductor memory 5001. A row decoder and word line driver 5004 selects one of a plurality of word lines (WLn0 through WL511) in the normal array 5002 in accordance with the row address, and drives the selected word line.

The upper 6 bits of the row address are supplied to a row decoder and word line driver 5005. The row decoder and word line driver 5005 selects one of a plurality of word lines (WLp0 through WLp63) in the prefetch array 5003 in accordance with the upper 6 bits of the row address, and drives the selected word line.

When the word line selected in the normal array 5002 is driven, memory cells connected to the word line is amplified by a sense amplifier driver 5006D and a sense amplifier 5006. Thus, the normal array 5002 is activated.

When the word line selected in the prefetch array 5003 is driven, memory cells connected to the word line is amplified by a sense amplifier driver 5007D and a sense amplifier 5007. Thus, the prefetch array 5003 is activated.

Next, a 10-bit column address is input to the semiconductor memory 5001. A column decoder 5008 controls a column switch CSW1 in accordance with the upper 7 bits of the column address. Data corresponding to the normal array 5002 selected by the column switch CSW1 is output to a local data line LD.

896-bit data corresponding to one word line in the normal array 5002 is divided into 112 groups, each of which has 8 bits. Which one of the 112 groups is to be selected is determined by the upper 7 bits of the column address. Eight-bit data corresponding to the selected group is output to the local data line LD.

The lower 3-bit of the column address are logically assigned to each of the 8-bit data continuously output.

Figure 15:
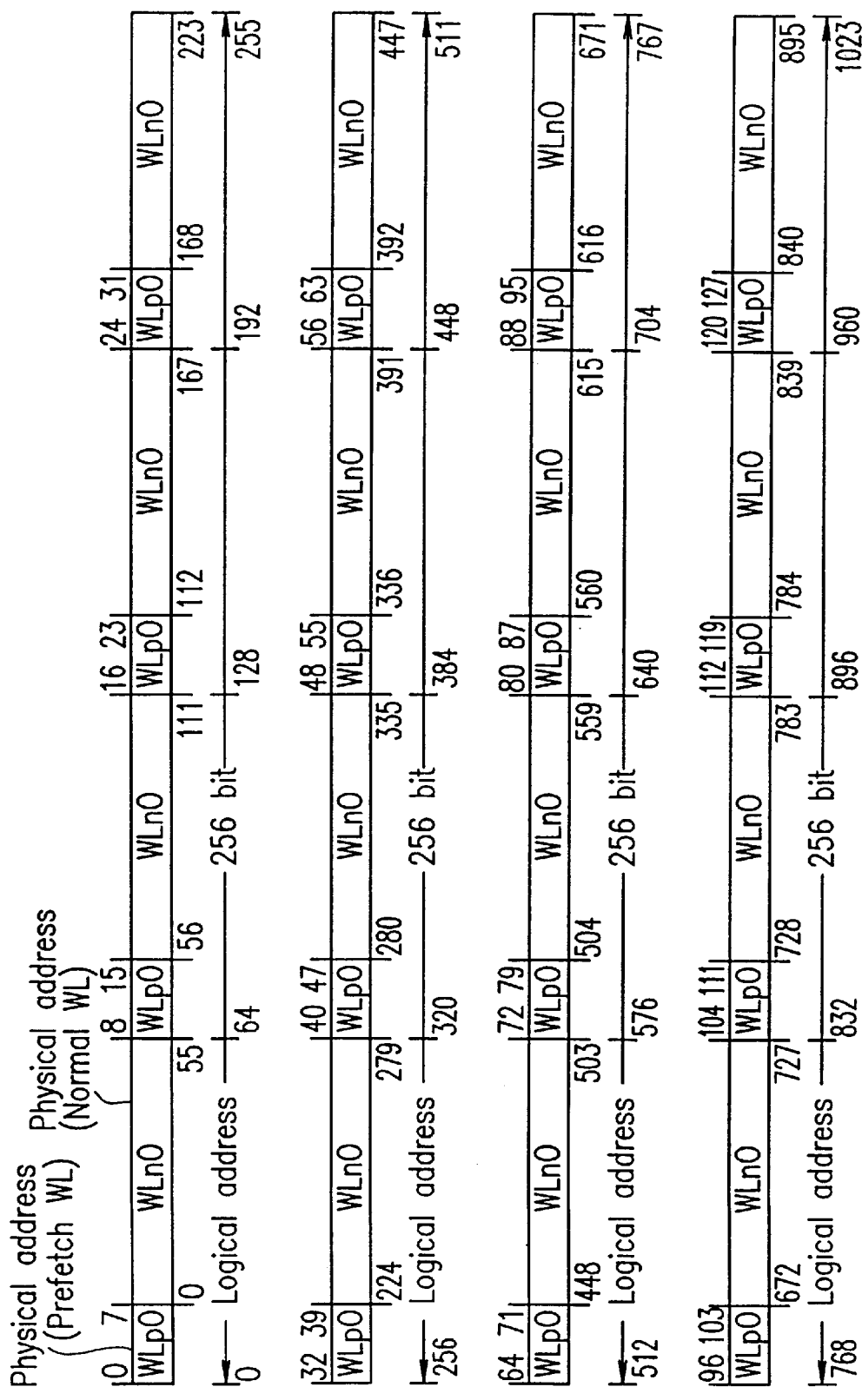
FIG. 15 is a view illustrating the relationship between a logical address and a physical address in one word line.

FIG. 15 illustrates the relationship between a logical address and a physical address in one word line. As shown in FIG. 15, logical addresses 0 through 7 corresponding to the leading 8 bits among logical addresses 0 through 64 corresponding to 64 bits are assigned to the prefetch array 5003, and logical addresses 8 through 63 corresponding to the 56 bits subsequent to the leading 8 bits are assigned to the normal array 5002.

Accordingly, when a row address is designated, 8-bit data provided at every 64th column address is output from the prefetch array 5003. By activating the memory cell in the prefetch array 5003 which corresponds to a row address in the vicinity of the word line activated in the normal array 5002 and a specified column address, the access speed to the memory cell is raised.

In the normal array 5002 shown in FIG. 14, no data is stored at the 16 specified column address starting from hex000 and provided at every 64th addresses (i.e., hex000, hex040, hex080, . . . and hex3C0). When a column address hits one of these 16 specified column addresses, a select signal Sel is turned HIGH. As a result, a column decoder 5008 is not activated. When the select signal Sel is HIGH, a column decoder 5009 is activated.

Supplied to the column decoder are the lower 3 bits of the row address and 4-bit data including a specified column address. The column decoder 5009 controls a column switch CSW2 in accordance with the lower 3 bits of the row address and the 4-bit data indicating the specified column address. Data corresponding to the prefetch array 5003 selected by the column switch CSW2 is output to the local data line LD.

1024-bit data corresponding to one word line in the prefetch array 5003 is assigned to 8 sections arranged at every 128th bit. The 8 sections each include 16 memory cells each having a width of 8 bits. Which one of the 8 sections is to be selected is determined by the lower 3 bits of the row address. The selected section corresponds to the word line selected from the 8 word line set in the normal array 5002. Which one of the 16 memory cell included in the selected section is to be selected is determined by the 4-bit data indicating the specified column address. The selected memory cell corresponds to one of the column address which is selected from the 16 specified column addresses (hex000, hex040, hex080, . . . and hex3C0). Eight-bit data corresponding to the selected memory cell is output to the local data line LD.

By selectively activating the column decoder 5008 or 5009 in accordance with the select signal Sel, data is selectively output from the normal array 5002 or from the prefetch array 5003. When data is output from the normal array 5002, no data is output from the prefetch array 5003. When data is output from the prefetch array 5003, no data is output from the normal array 5002. Accordingly, one local data line LD which is common to the normal array 5002 and the prefetch array 5003 can be provided. Thus, the chip area of the semiconductor memory 5001 can be reduced.

Eight-bit data output to the local data line LD is amplified by a read amplifier 5010 and output to a global data line GD. The data output to the global data line GD is output to a device external to the semiconductor memory 5001 via an I/O circuit RD shown in FIG. 16.

Example 5

Figure 16:
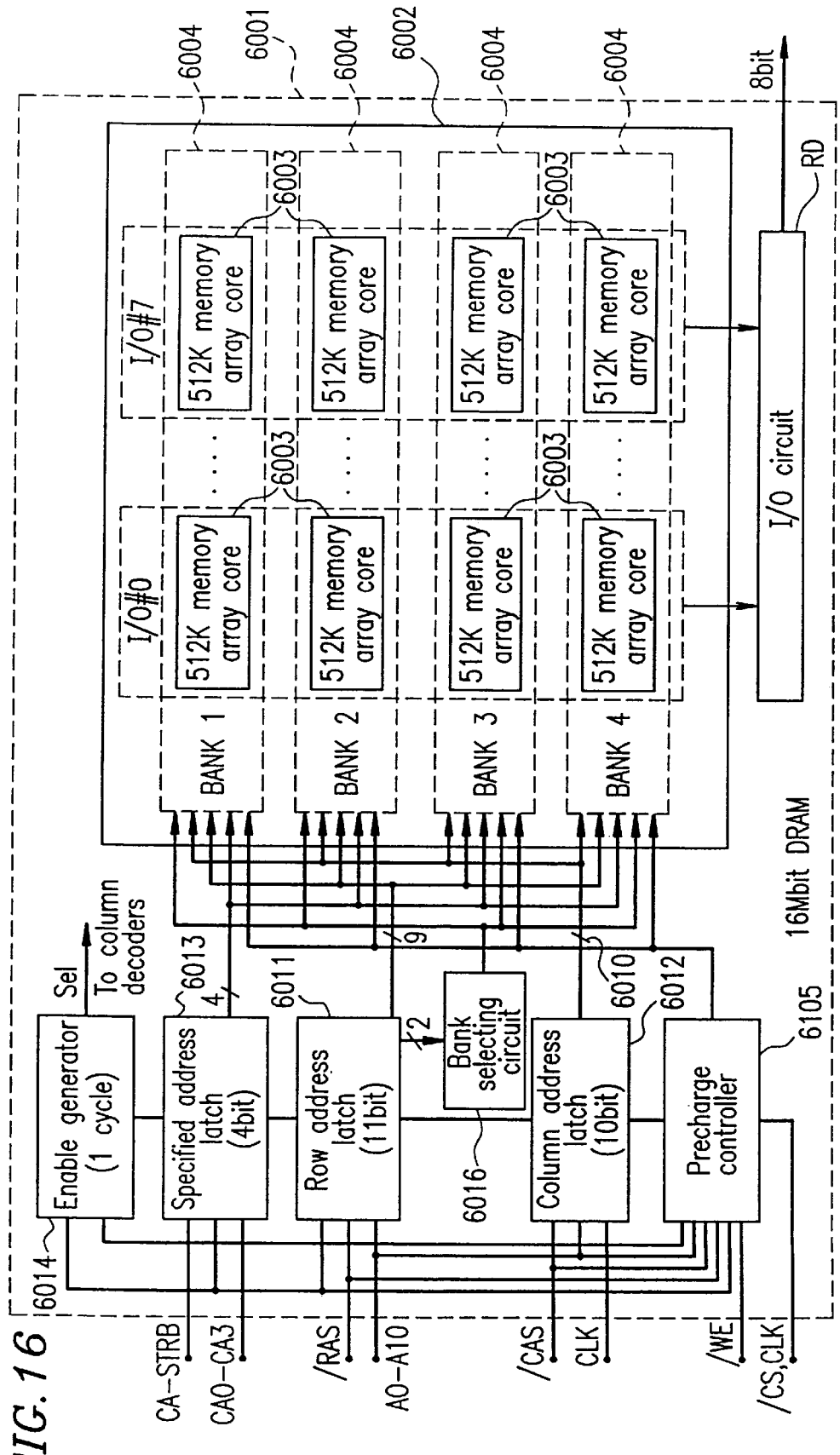
FIG. 16 is a block diagram showing a structure of a semiconductor memory 6001 in a fifth example according to the present invention.

FIG. 16 is a block diagram showing a structure of a semiconductor memory 6001 in a fifth example according to the present invention.

The semiconductor memory 6001 is a DRAM having a 16 Mbits of memory capacity. In more detail, the semiconductor memory 6001 has a memory structure of 4 banks×9 (row)×10 (column)×8-bit I/O devices. A memory core 6002 of the semiconductor memory 6001 has 32 512K memory array cores 6003.

The memory core 6002 is divided into 4 banks 6004, which are represented as BANK1 through BANK4 in FIG. 16. The 4 banks, BANK1 through BANK4, can be independently accessed.

The semiconductor memory 6001 has 8 I/O devices, which are represented as I/O#0 through I/O#7 in FIG. 16. 1-bit data is input to or output from each I/O device.

A row address latch 6011 latches an 11-bit row address from address buses (A0 through A10). The row address latch 6011 supplies the upper 2 bits of the row address to a bank selecting circuit 6016. The bank selecting circuit 6016 selects one of the 4 banks 6004 in accordance with the upper 2 bits of row address. The 4 banks 6004 can be independently activated in accordance with the row address. Accordingly, data corresponding to a maximum of 4 banks is latched by a sense amplifier (not shown).

A column address latch 6012 latches a 10-bit column address from the address bus (A0 through A10). The column address corresponds to, for example, the upper 10 bits of the address bus (A0 through A10). The column address is latched at different timing from the latching of the row address.

A specified address latch 6013 latches 4-bit data from column address buses (CA0 through CA3). The 4-bit data is used to designate a specific column address. The 4-bit data is latched by the specified address latch 6013 at the timing when a clock signal CLK is changed from LOW to HIGH while a control signal CA-STRB is LOW.

During the period of one cycle from the clock signal CLK is changed from LOW to HIGH while the control signal CA-STRB is LOW, an enable generator 6014 keeps a select signal Sel HIGH.

The 512K memory array cores 6003 each has an identical structure with that of the semiconductor memory 5001 shown in FIG. 14. Although not shown in FIG. 16, the select signal Sel is supplied to the column decoders 5008 and 5009 (FIG. 14) in each 512K memory array core 6003. When the select signal Sel is HIGH, the column decoder 5009 for the prefetch array 5003 (FIG. 14) is activated, and the column decoder 5008 for the normal array 5002 (FIG. 14) is inactivated.

A precharge controller 6015, in response to the state in which a chip select signal /CS, a RAS signal /RAS and a write enable signal /WE are all LOW, precharges the normal array 5002 in accordance with the row address. The precharge controller 6015, in response to the state in which the chip select signal /CS, the RAS signal /RAS, the write enable signal /WE, a CAS signal /CAS and a control signal CA-STRB are all LOW, precharges the normal array 5002 and the prefetch array 5003 in accordance with the row address. When normal array 5002 and the prefetch array 5003 are precharged, read and write of consecutive data can possibly be interrupted.

Figure 17:
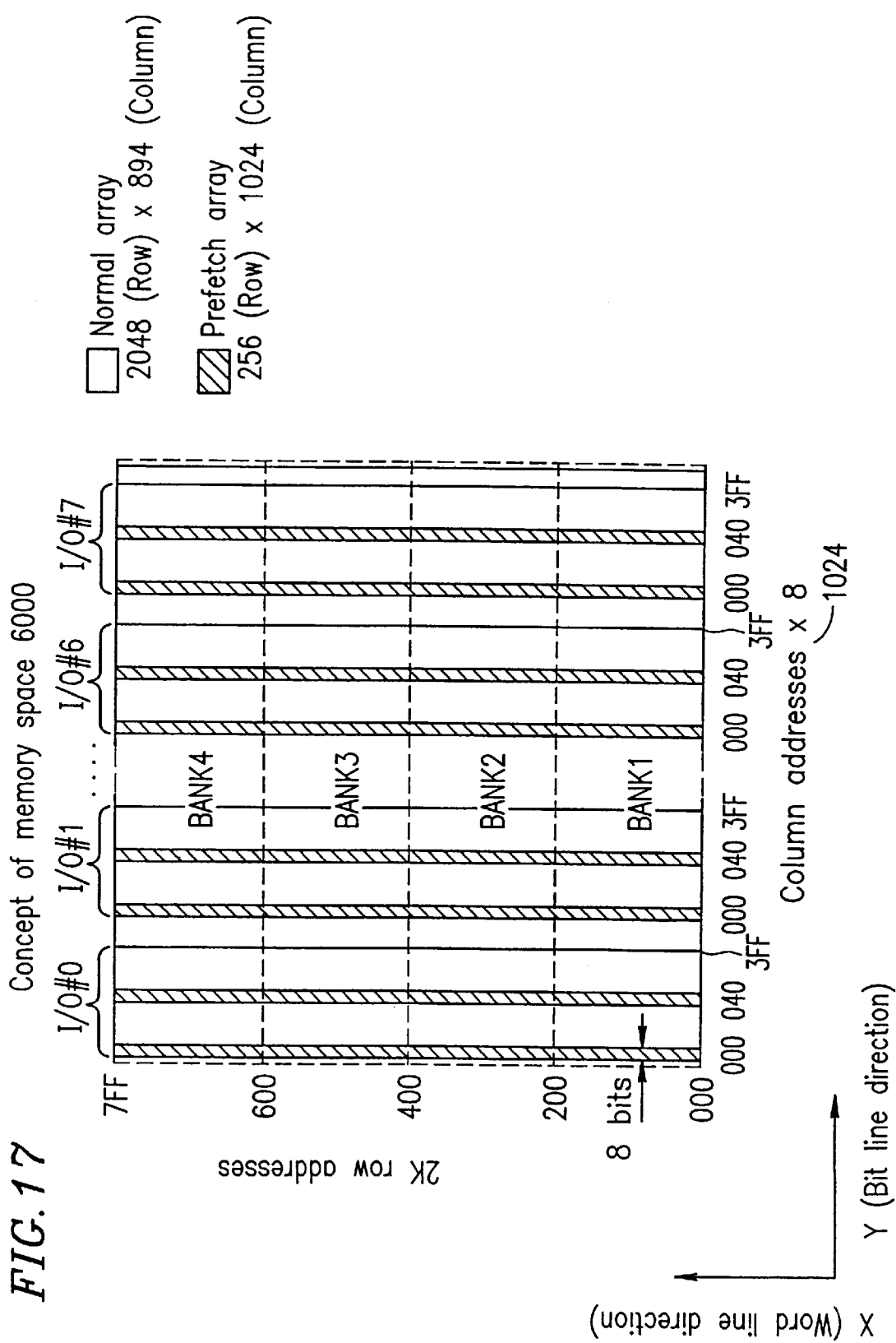
FIG. 17 is a conceptual view of a memory space 6000 6000 of the semiconductor memory 6001.

FIG. 17 is a conceptual view of a memory space 6000 of the semiconductor memory 6001 (FIG. 16). In FIG. 17, the hatched area is an area assigned for prefetch array 5003. Accordingly, a column address corresponding to the row address is one of the column addresses provided at every 64th address from hex000, data is output from the memory cell in the prefetch array 5003.

Figure 18:
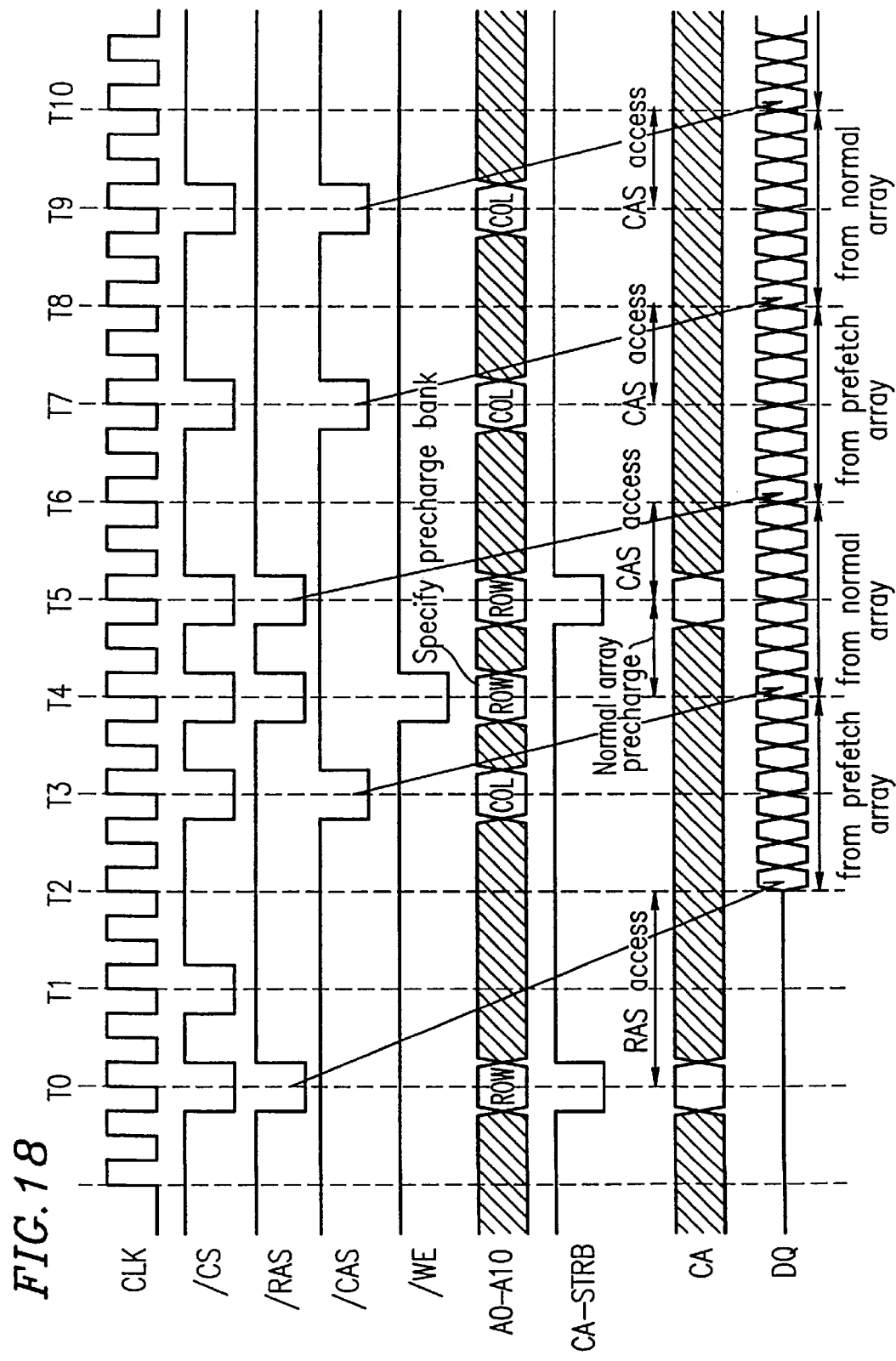
FIG. 18 is a timing diagram illustrating an exemplary operation of the semiconductor memory 6001.

FIG. 18 shows operation timing of the semiconductor memory 6001. Hereinafter, an exemplary operation of the semiconductor memory 6001 will be described with reference to FIGS. 16 and 18.

Data is read from the semiconductor memory 6001 in the following manner.

At time T0, a chip select signal /CS is LOW and a RAS signal /RAS is LOW. A row address latch 6011, in response to the LOW chip select signal /CS and the LOW RAS signal /RAS, latches an address on the address bus (A0 through A10) as a row address.

Further at time T0, a control signal CA-STRB is LOW. The specified latch 6013 latches 4-bit data on the column address bus (CA0 through CA3). At time T2, 8-bit data is output from the prefetch array 5003 based on the 4-bit data and the row address. Thus, a row access is performed.

At time T0, the CAS signal /CAS does not become LOW, and the control signal CA-STRB becomes LOW instead. As a result, the row access is performed. Which one of the CAS signal /CAS or the control signal CA-STRB is to be made LOW is determined by a memory controller (not shown) based on the address to be accessed.

At time T3, the CAS signal /CAS is LOW. A column address latch 6012, in response to the LOW CAS signal /CAS, latches an address on the address bus (A0 through A10) as a column address. At time T4, 8-bit data is output from the normal array 5002 based on the row address and the column address. Thus, a column access is performed.

At time T4, a new row address is latched from the address bus (A0 through A10), and precharging of the normal array 5002 is started. The prefetch array 5003 is not precharged and is maintained activated.

At time T5, new 4-bit data is latched from the column address bus (CA0 through CA2). At time T6, 8-bit data is output from the 4-bit data and the new row address. Thus, a row access is performed.

While the normal array 5002 is precharged, an access to the prefetch array 5003 is started. By overlapping the precharge period for precharging the normal array 5002 and the period from the input of the 4-bit data until the start of the data output from the prefetch array 5003, the data can be output from the prefetch array 5003 earlier. The continuous, uninterrupted data output as shown in FIG. 18 is realized by shortening the data output time period.

The semiconductor memory 6001 is very effective when the row address is changed relatively frequently and the column address designated first after the row address is designated matches the specified column address at a high probability. In fact, when a plurality of applications are being executed on operating software such as Windows® and the hard disk drive is frequently being accessed, it is expected that the row address is changed relatively frequently and that the column addresses at which the applications are switched or data transfer from the hard disk drive is started concentrates on several specified column addresses. Such specified column addresses have, for example, round numerals such as hex000, hex040 and the like. Accordingly, by assigning memory cells in the prefetch array 5003 (e.g., DRAM cells) to such specified column addresses and assigning memory cells in the normal array 5002 (e.g., DRAM cells) to the other column addresses, the overall access speed to the semiconductor memory 6001 can be improved.

The semiconductor memory 6001 has 4 banks. After the word line is activated, each of the 4 banks can hold one-page data by the sense amplifier 5006 and the sense amplifier 5007. Thus, the semiconductor memory 6001, as a whole, can keep the 4-page data readable and writable at a high speed. Accordingly, when the row address hits the row address corresponding to the word line activated in each bank, a high-speed access is realized even when the column address changes randomly as in the case of a conventional DRAM.

Figure 19:
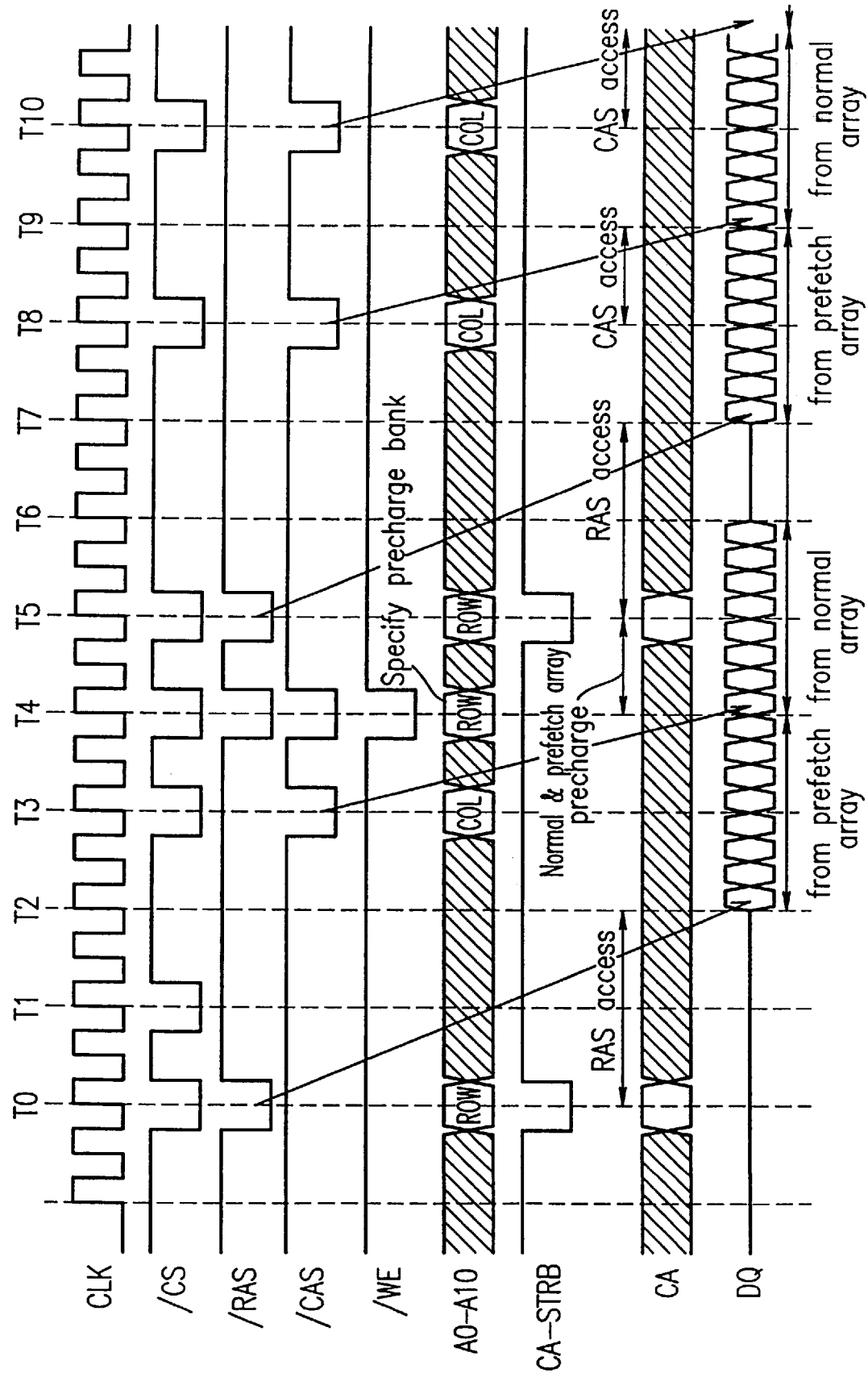
FIG. 19 is a timing diagram illustrating an another exemplary operation of the semiconductor memory 6001.

An external memory controller always grasps the addresses in the normal array 5002 and the prefetch array 5003 which are activated, and determines whether or not an address for the next access hits the prefetch array 5003 which is activated. When the prefetch array 5003 is hit, i.e., when data necessary for the next access is stored in the prefetch array 5003, only the normal array 5002 is precharged. As a result, the continuous, uninterrupted data output as shown in FIG. 18 is realized. However, when the prefetch array 5003 is not hit, i.e., when data necessary for the next access is not stored in the prefetch array 5003, the memory controller turns all of the chip select signal /CS, the RAS signal /RAS, the CAS signal /CA, the write enable signal /WE and the control signal CA-STRB to LOW so as to precharge the normal array 5002 and the prefetch array 5003 simultaneously at time T5 as shown in FIG. 19. Thus, the word lines in the normal array 5002 and the prefetch array 5003 corresponding to the address to be accessed next are activated. In such a case, data output is interrupted (time T6–T7), unlike the usual RAS access.

In the fifth example, information representing a specified column address is input to the specified address latch 6013 from the column address buses (CA0 through CA2) independently from the row address and the column address, and simultaneously with the row address. Such a system allows a memory cell in the prefetch array 5003 to be selected at the time of row access, resulting in a high-speed access to the memory cell in the prefetch array 5003. It is not necessary to provide a special pin for inputting the information representing the specified column address. Such a special pin is not necessary, for example, when the address information and the control information are input to the semiconductor memory 6001 in a protocol format so that the row address and the column address are input in the same packet.

Example 6

Figure 20:
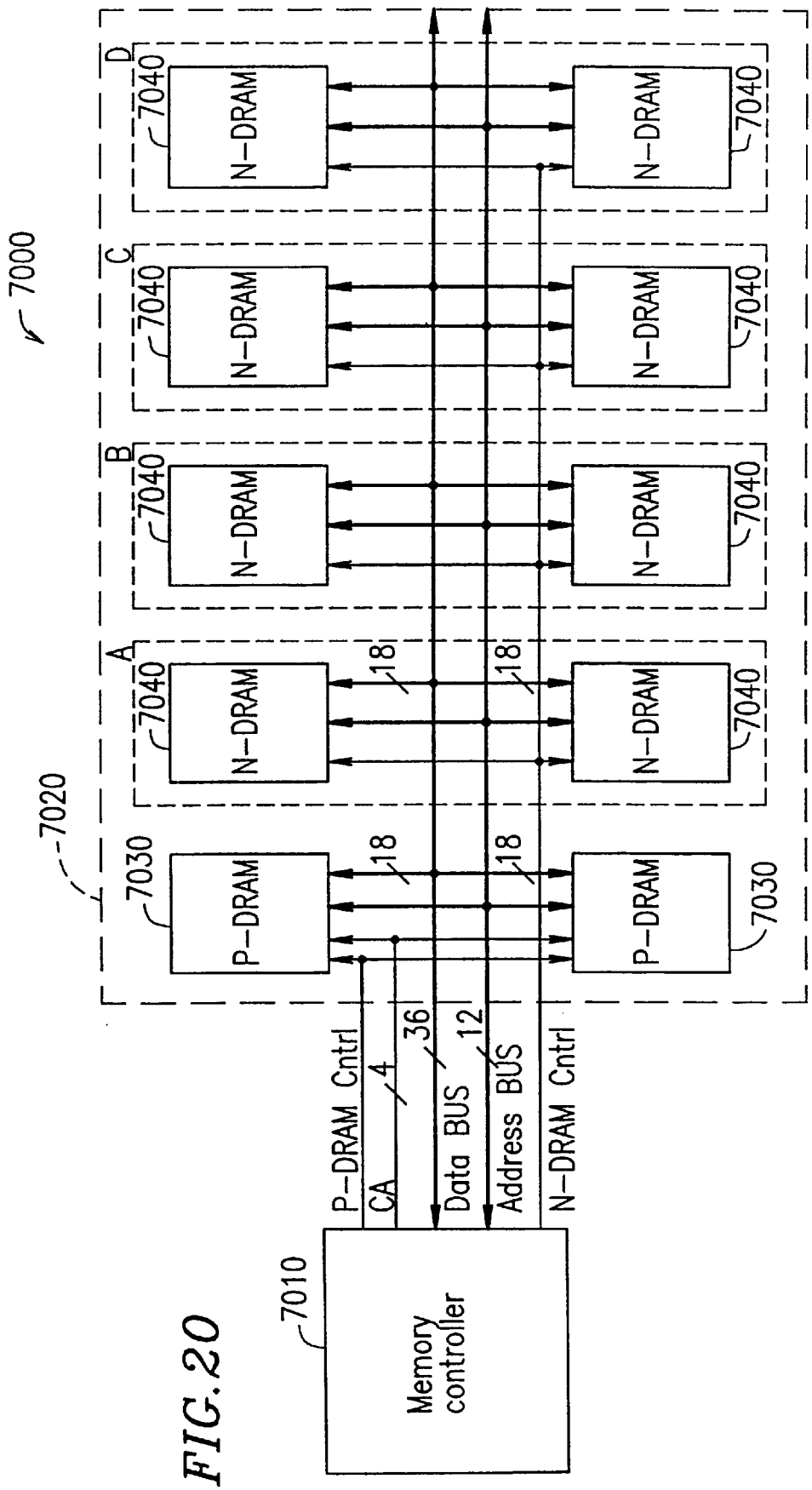
FIG. 20 is a block diagram showing a structure of a memory system 7000 in a sixth example according to the present invention.

FIG. 20 shows a structure of a memory system 7000 in a sixth example according to the present invention. The memory system 7000 includes a memory module 7020 and a memory controller 7010 for controlling the memory module 7020. The memory module 7020 and the memory controller 7010 are connected to each other via a transmission path for transmitting information (e.g., data bus or address bus).

The memory module 7020 includes 2 DRAM devices 7030 (P-DRAM devices) for prefetch array 5003 and 8 DRAM devices 7040 (N-DRAM devices) for normal array 5002.

P-DRAM devices 7030 and the N-DRAM devices 7040 each have a memory structure of 4M×18 bits. The DRAM devices each have a memory capacity of 72 Mbits. The DRAM devices can be, for example, synchronous DRAMs. To each of the DRAM devices, a 12-bit address (banks and rows) and a 10-bit address (column) are input via a common address bus (12-bit). In response to the input addresses, the DRAM devices output 8-bit data in synchronization with the clock signal CLK.

In the memory module 7020, data can be output from a plurality of DRAM devices simultaneously, and thus the bit width of the data bus is 36 bits (32 bits for transmitting the data+4 bits for transmitting parity bits). Connected in parallel to the data bus are data pins of the two P-DRAM devices 7030. Furthermore, data pins of every two N-DRAM devices 7040 are connected in parallel. Four sets of N-DRAM devices 7040 are connected in series.

The memory module 7020 acts as a 64-Mbyte memory module. As shown in FIG. 21, a memory space of hex0000000 through hex3FFFFFF is assigned to the memory module 7020. The memory space is covered with the P-DRAM devices 7030 and the N-DRAM devices 7040. To the N-DRAM devices 7040, a row access is performed at a low speed. Accordingly, in the memory module 7020, a row access is performed using the P-DRAM devices 7030, and column accesses subsequent to the row access are performed using the N-DRAM devices 7040.

In this manner, the memory module 7020 uses the P-DRAM devices 7030, instead of the N-DRAM devices 7040, for performing an access to a specified column address which is time-consuming when performed by the N-DRAM devices 7040, so as to improve the overall performance of the memory system 7000.

Figure 23:
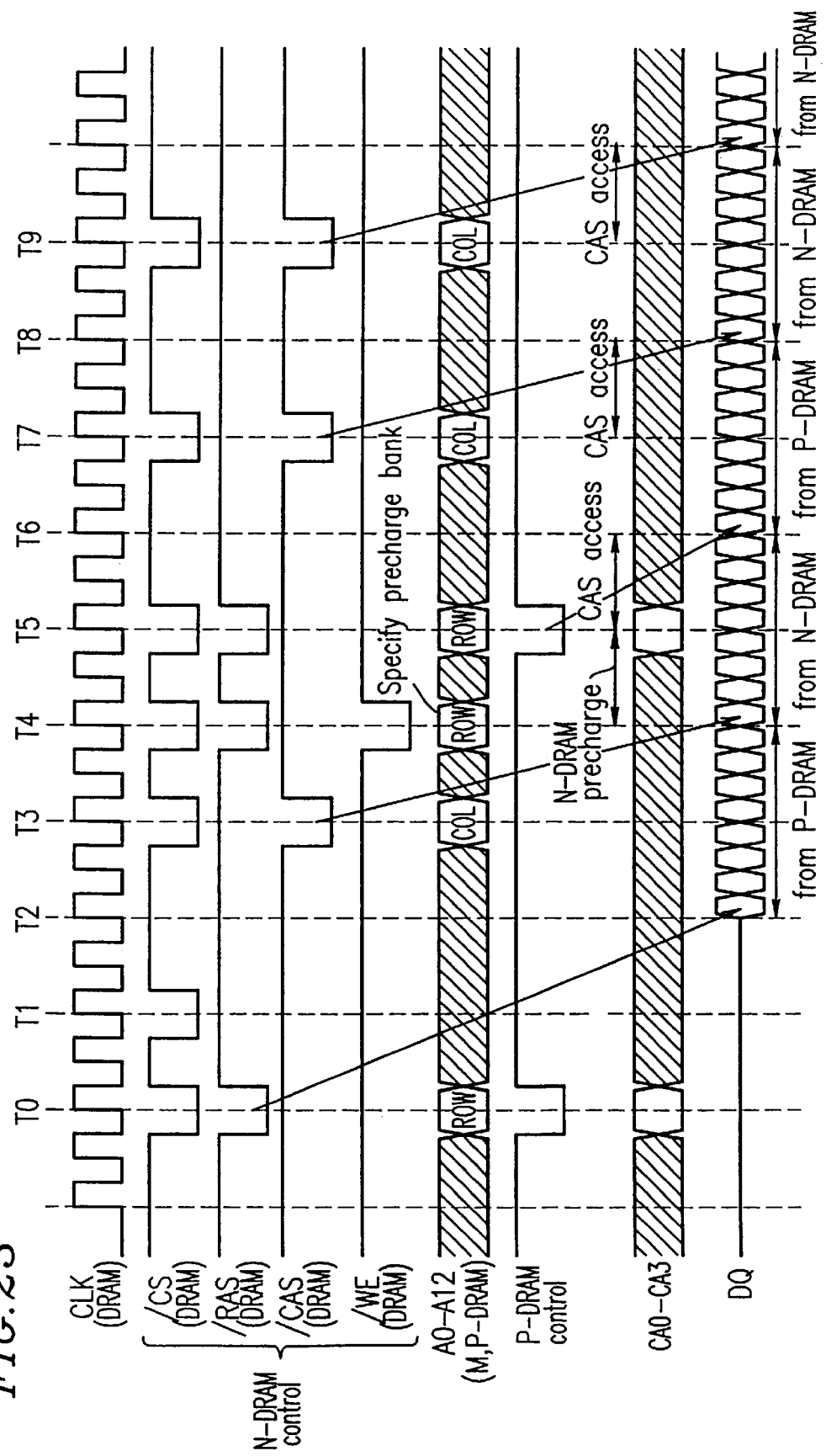
FIG. 23 is a timing diagram illustrating an exemplary operation of the memory system 7000.

FIG. 22 is a conceptual view of a memory space 7000 of DRAM devices. The P-DRAM devices 7030 corresponds to 8-bit spaces provided at every 32nd address from hex000 and basically are not precharged even when the N-DRAM devices 7040 are precharged. Thus, data can be read and written at the CAS access speed. As a result, the continuous, uninterrupted data output as shown in FIG. 23 is realized.

In the case of FIG. 21, where DRAM device groups (FIG. 20) A through D are assigned in a memory map, the bank conflict in the DRAM device can be reduced.

The memory system 7000 in the sixth example is especially effective in a personal computer or a work station in which a cache memory is built in and continuous data read and write are performed in the column address direction. The specified column address can be made programmable using, for example, a nonvolatile memory cell. Such a system allows the specified column address to be optimized for each of various applications. For example, the user can reset the specified column address so as to be suitable to a graphics application. In such a case, a semiconductor memory according to the present invention is applicable to a graphics application having no cache memory. Thus, a semiconductor memory according to the present invention is applicable to more fields.

According to the present invention, a high-speed memory cell is assigned to a specified column address, and thus the speed of the row access performed before the column access is improved in accordance with a given probability. A specified column address is set in accordance with an actual application, and a memory controller is used to satisfactorily control the access to high-speed memory cells and the access to the other memory cells performed after a row access is performed, so that both types of accesses are performed at a high speed. In this manner, random access speed in the row direction is improved compared to the case of the conventional art. Thus, the overall performance of the memory system is enhanced.

In the case where the memory array of the semiconductor memory is divided into a plurality of sub arrays, a specified column address in one of the sub arrays can be assigned to the memory cells in the other sub arrays. In this manner, the above-described effect is obtained. The reason for this is that the speed of row access is raised in accordance with a certain probability.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory, comprising:
   a plurality of memory cells; and
   an access section for accessing a memory cell, among the plurality of memory cells, corresponding to a row address and a column address,
   wherein:
   the plurality of memory cells comprise a plurality of first memory cells accessible at a first access speed and a plurality of second memory cells accessible at a second access speed which is higher than the first access speed, and
   for each row address, there exists a plurality of access units in sequence, and at least two of the plurality of access units included in the sequence each comprise at least one of the second memory cells at a leading column address assigned thereto followed by at least one of the first memory cells.

2. A semiconductor memory according to claim 1, wherein each of the plurality of first memory cells in a DRAM cell and each of the plurality of second memory cells is an SRAM cell.

3. A semiconductor memory according to claim 1, wherein the plurality of memory cells are divided into a plurality of banks.

4. A semiconductor memory according to claim 3, wherein a selected access unit of the plurality of access units comprises at least one second memory cell at a leading column address assigned thereto followed by at least one first memory cell.

5. A semiconductor memory according to claim 1, wherein information corresponding to the leading column address is input to the semiconductor memory simultaneously with the row address.

6. A semiconductor memory according to claim 1, wherein the access section starts accessing one of the plurality of second memory cells while precharging one of the plurality of first memory cells.

7. A semiconductor memory according to claim 1, wherein each of the plurality of first memory cells and each of the plurality of second memory cells have an identical structure.

8. A semiconductor memory according to claim 1, wherein:
- a memory array is divided into at least a first sub array and a second sub array,
- the first sub array includes the plurality of first memory cells, and the second sub array includes the plurality of second memory cells, and
- a specified column address in the first sub array is assigned to a second memory cell in the second sub array.

9. A memory system, comprising:
- a semiconductor memory; and
- a memory controller for controlling the semiconductor memory,
- the semiconductor memory comprising:
  - a plurality of memory cells; and
  - an access section for accessing a memory cell, among the plurality of memory cells, corresponding to a row address and a column address,
  - wherein:
    - the plurality of memory cells comprise a plurality of first memory cells accessible at a first access speed and a plurality of second memory cells accessible at a second access speed which is higher than the first access speed, and
    - for each row address, there exists a plurality of access units in sequence, and at least two of the plurality of access units included in the sequence each comprise at least one of the second memory cells at a leading column address assigned thereto followed by at least one of the first memory cells.

10. A memory system according to claim 9, wherein each of the plurality of first memory cells is a DRAM cell and each of the plurality of second memory cells is an SRAM cell.

11. A memory system according to claim 9, wherein the plurality of memory cells are divided into a plurality of banks.

12. A semiconductor memory, comprising:
- a plurality of memory cells; and
- an access section for accessing a memory cell, among the plurality of memory cells, corresponding to a row address and a column address,
- wherein:
  - the plurality of memory cells comprise a plurality of first memory cells accessible at a first access speed and a plurality of second memory cells accessible at a second access speed which is higher than the first access speed, and
  - for each row address, there exists a plurality of access units in sequence, at least one access unit of the plurality of access units comprising at least one of the second memory cells at a leading column address assigned thereto followed by at least one of the first memory cells.

13. A semiconductor memory according to claim 12, further comprising programmable means for allowing the leading column address assigned to the at least one second memory cell to be programmably altered.

14. A semiconductor memory according to claim 12, wherein information corresponding to only the leading column address is input to the semiconductor memory simultaneously with the row address.

15. A memory system, comprising:
- a semiconductor memory as recited in claim 12; and
- a memory controller for controlling the semiconductor memory.

* * * * *